US009825154B2

United States Patent
Yap

(10) Patent No.: US 9,825,154 B2
(45) Date of Patent: Nov. 21, 2017

(54) ROOM TEMPERATURE TUNNELING SWITCHES AND METHODS OF MAKING AND USING THE SAME

(71) Applicant: MICHIGAN TECHNOLOGICAL UNIVERSITY, Houghton, MI (US)

(72) Inventor: Yoke Khin Yap, Houghton, MI (US)

(73) Assignee: Michigan Technological University, Houghton, MI (US)

( * ) Notice: Subject to any disclaimer, the term of this patent is extended or adjusted under 35 U.S.C. 154(b) by 0 days.

(21) Appl. No.: 14/359,818

(22) PCT Filed: Nov. 28, 2012

(86) PCT No.: PCT/US2012/066796
§ 371 (c)(1),
(2) Date: May 21, 2014

(87) PCT Pub. No.: WO2013/082117
PCT Pub. Date: Jun. 6, 2013

(65) Prior Publication Data
US 2015/0097193 A1  Apr. 9, 2015

Related U.S. Application Data

(60) Provisional application No. 61/564,017, filed on Nov. 28, 2011.

(51) Int. Cl.
*H01L 29/06* (2006.01)
*H01L 29/66* (2006.01)
(Continued)

(52) U.S. Cl.
CPC ........ *H01L 29/66977* (2013.01); *B82Y 10/00* (2013.01); *H01L 29/068* (2013.01);
(Continued)

(58) Field of Classification Search
CPC ......... H01L 29/66931; H01L 29/66954; H01L 29/88; H01L 29/882; H01L 29/66977;
(Continued)

(56) References Cited

U.S. PATENT DOCUMENTS 5,608,231 A    3/1997   Ugajin et al.
5,731,598 A *  3/1998   Kado .................... B82Y 10/00
                                                           257/14

(Continued)

FOREIGN PATENT DOCUMENTS

WO    2013/082117    6/2013

OTHER PUBLICATIONS

Chen et al. "Nano Au-decorated boron nitride nanotubes: Conductance modification and field emission enhancement" in Applied Physics Letter vol. 92, p. 243105. Pubished by American Institute of Physics in 2008.*

(Continued)

*Primary Examiner* — Jesse Y Miyoshi
*Assistant Examiner* — Tuan A Hoang
(74) *Attorney, Agent, or Firm* — Michael Best & Friedrich LLP

(57) ABSTRACT

The tunneling channel of a field effect transistor comprising a plurality of tunneling elements contacting a channel substrate. Applying a source-drain voltage of greater than a turn-on voltage produces a source-drain current of greater than about 10 pA. Applying a source-drain voltage of less than a turn-on voltage produces a source-drain current of less than about 10 pA. The turn-on voltage at room temperature is between about 0.1V and about 40V.

11 Claims, 19 Drawing Sheets

(51) Int. Cl.
*H01L 29/775* (2006.01)
*H01L 29/12* (2006.01)
*H01L 29/10* (2006.01)
*B82Y 10/00* (2011.01)
*H01L 29/20* (2006.01)
*H01L 49/00* (2006.01)

(52) U.S. Cl.
CPC ...... *H01L 29/0665* (2013.01); *H01L 29/0673* (2013.01); *H01L 29/0676* (2013.01); *H01L 29/1029* (2013.01); *H01L 29/1033* (2013.01); *H01L 29/127* (2013.01); *H01L 29/2003* (2013.01); *H01L 29/775* (2013.01); *H01L 49/006* (2013.01)

(58) Field of Classification Search
CPC ............. H01L 29/0665; H01L 29/0669; H01L 29/0673; H01L 29/0676; H01L 29/127; H01L 29/775; H01L 49/003; H01L 49/006
See application file for complete search history.

(56) References Cited

U.S. PATENT DOCUMENTS

| | | | |
|---|---|---|---|
| 6,798,000 B2* | 9/2004 | Luyken ................. | B82Y 10/00 257/213 |
| 2005/0139867 A1* | 6/2005 | Saito et al. .................... | 257/213 |
| 2006/0237537 A1* | 10/2006 | Empedocles et al. ......... | 235/439 |
| 2006/0252276 A1* | 11/2006 | Choi et al. .................... | 438/775 |
| 2009/0134386 A1 | 5/2009 | Nakako et al. | |
| 2009/0213368 A1* | 8/2009 | Roper et al. .................. | 356/300 |
| 2009/0224230 A1 | 9/2009 | Pesetski et al. | |
| 2010/0181550 A1 | 7/2010 | Kotani et al. | |
| 2010/0276667 A1* | 11/2010 | Kim ....................... | B82Y 10/00 257/24 |

OTHER PUBLICATIONS

Chen, et al., "Nano Au-decorated boron nitride nanotubes: Conductance modification and fieldemission enhancement" Appl. Phys. Lett. 92, 243105 (2008).
Cui, et al., "High performance silicon nanowire field effect transistors." Nano Letters 3, 149 (Feb. 2003) 149-152.
Duan et al., "High-performance thin-film transistors using semiconductor nanowires and nanoribbons." Nature 425, 274-278 (Sep. 18, 2003).
Duan, et al., "Indium phosphide nanowires as building blocks for nanoscale electronic and optoelectronic devices." Nature 409, 66-69 (Jan 4, 2001).
Ghassemi, et al., "Field emission and strain engineering of electronic properties in boron nitride nanotubes." Nanotechnology 23, (Mar 16, 2012) 1-6.
Goldberger, et al., ZnO nanowire transistors. J Phys Chem B 109, 9-14 (Jan. 13, 2005).
Karre, et al., "Room Temperature Operational Single Electron Transistor Fabricated by Focused Ion Beam Deposition," J. Appl. Phys. 102, 24316 (2007).
Lee, et al., "Effective growth of boron nitride nanotubes by thermal chemical vapor deposition." Nanotechnology 19, (Nov. 12, 2008).
Lee, et al., "Patterned Growth of Boron Nitride Nanotubes by Catalytic Chemical Vapor Deposition." Chem Mater 22, 1782-1787 (Mar. 9, 2010).
Li, et al., Oxygen sensing characteristics of individual ZnO nanowire transistors. Appl Phys Lett 85, 6389-6391 (Dec. 27, 2004).
Lin et al., "100-GHz Transistors from Wafer-Scale Epitaxial Graphene." Science 327, 662 (Feb. 5, 2010).
Novoselov et al., "Electric field effect in atomically thin carbon films." Science 306, 666-669 (Oct. 22, 2004).
Sainsbury, et al., "Self-assembly of gold nanoparticles at the surface of amine- and thiol-functionalized born nitride nanotubes," J. Phys. Chem. C 111, 12992-12999 (2007).
International Search Report and Written Opinion for Application No. PCT/US2012/066796 dated Feb. 6, 2013 (13 pages).

* cited by examiner

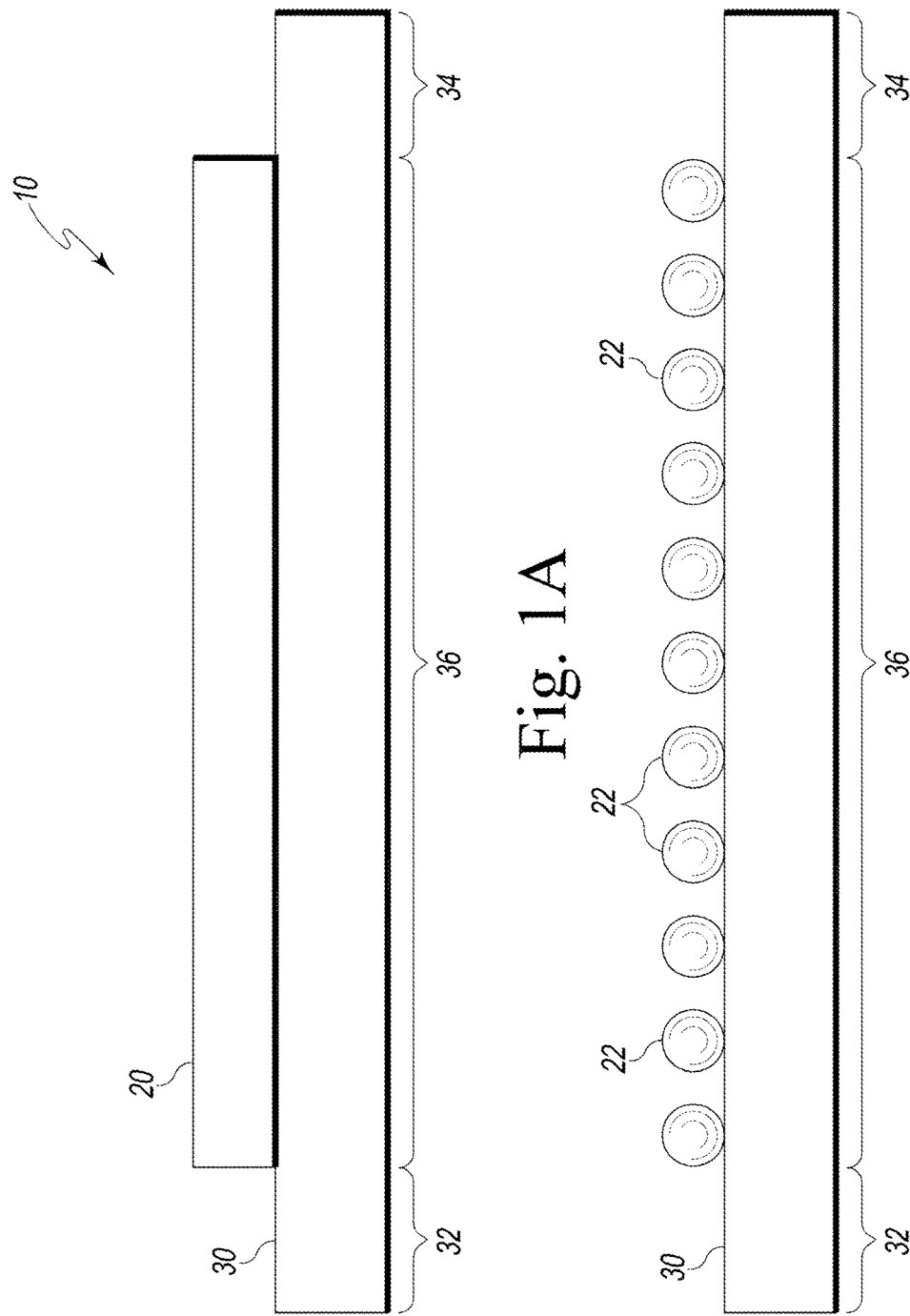

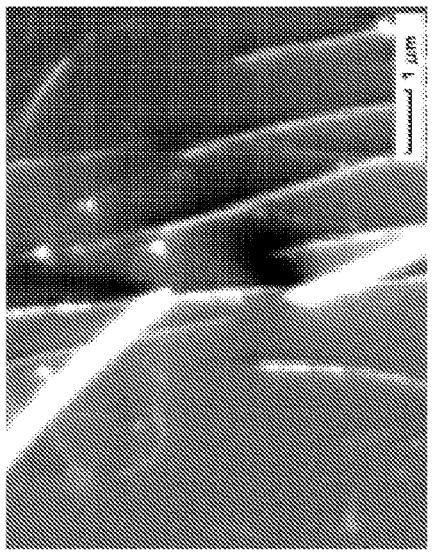

ROOM TEMPERATURE TUNNELING SWITCHES AND METHODS OF MAKING AND USING THE SAME

CROSS-REFERENCE TO RELATED APPLICATIONS

This application is a national stage filing under 35 U.S.C. 371 of International Application No. PCT/US2012/066796 filed Nov. 28, 2012, which claims priority to U.S. Provisional Application No. 61/564,017 filed Nov. 28, 2011, which are incorporated by reference herein.

STATEMENT REGARDING FEDERALLY SPONSORED RESEARCH

This invention was made with government support under Grant Number DE-FG02-06ER46294 awarded by the DOE. The U.S. government has certain rights in this invention.

FIELD OF USE

The present invention relates to tunneling channels of a field effect transistor and methods of making the same. The invention further relates to devices comprising the tunneling channel described herein and methods of making the same. The invention further relates to oriented arrays comprising a plurality of the tunneling channel or device described herein and methods of making the same.

BACKGROUND

Silicon-based transistors have been the key components in electronic devices for half a century. Further miniaturization of electronic devices is stymied by various issues including short channel effects and high heat dissipation. The use of carbon nanotubes, nanowires, and graphene in switching devices encounters similar issues as electron transport is based on tuning of conduction channels of these semiconducting materials.

The feature size of silicon field effect transistors (FETs) has continued to decrease and has led to faster and smaller electronics. However, miniaturization has created increasing difficulties in production that can eventually compromise the performance of future devices. These future FETs will encounter 1) high power consumption due to leakage in the semiconducting conduction channels; 2) short channel effects as the conduction length approaches the scale of the depletion layer width, and 3) high contact resistance between electrodes and the conduction channels. During the past two decades, nanoscale semiconductor materials have been explored for their potential use as transistors at room temperature. These include single-walled carbon nanotubes (SWCNTs), as well as nanowires (NWs) of silicon [Cui, 2003; Duan, 2003], indium phosphide [Duan, 2001], and zinc oxide [Li, 2004; Goldberger, 2005], etc. More recently, graphene, as a zero-gap semiconductor, was demonstrated as a prospective two dimensional (2D) material for ultra-high speed switches [Lin, 2010; Lee, 2008] by shifting the Fermi level through electrostatic gating. However, all these transistors are still based on the semiconducting nature of the materials, where associated issues of current leakage, short channel effects, and contact resistance remain unresolved.

Bergstrom et. al. have reported devices that are fabricated on planar substrates [Karre (2007)] by focused ion beam (FIB) depositions. However this approach is limited to tungsten QDs and require over coating by oxide films. The fabrication scheme is complicated and difficult to scale to small devices. In addition to these multi-QDs devices, there have been many demonstrations of single electron transistors using a single QD. These devices are challenging to make and are operational only at cryogenic temperatures.

High density Au nanoparticles deposited on BNNTs were reported for their electron field emission properties [Chen (2008)]. However, it was shown that this approach converts the BNNTs into conductors. Once the BNNTs are converted into conductors, they cannot be used as the tunneling channel in a field effect transistor.

High density Au nanoparticles deposited on BNNTs were also previously reported for thio-molecule functionalization [Sainsbury (2007)] but the electrical properties are unknown.

The current invention is different from the prior art, for example in the following aspects: 1) The tunneling channels, devices and arrays disclosed herein are operational at room temperature; 2) The tunneling channels, devices and arrays disclosed herein may be based on an array of tunneling elements on one-dimensional channel substrates (i.e., BNNTs or other insulating nanowires). This approach can potentially make a single array of tunneling elements between the source and drain electrode as the diameters of the 1D substrates are reduced to below 10 nm; 3) The tunneling channels, devices and arrays disclosed herein may be operational even without filling the gaps between tunneling elements with any oxide films (i.e., operational in air or vacuum); and 4) The size of the tunneling elements, and the spacing between two elements can be irregular (defect tolerant).

We show that arrays of gold quantum dots (QDs) deposited on the surfaces of insulating boron nitride nanotubes (BNNTs) can form the tunneling channel of tunnel field effect transistors (FETs). The tunneling current can be modulated at room temperature by tuning the lengths of QDs-BNNTs, the gaps between tunneling elements, and the gate potentials.

SUMMARY

This disclosure provides tunneling channels of a field effect transistor comprising a plurality of tunneling elements contacting a channel substrate. Applying a source-drain voltage of greater than a turn-on voltage produces a source-drain current of greater than about 10 pA and applying a source-drain voltage of less than the turn-on voltage produces a source-drain current of less than about 10 pA. The turn-on voltage at room temperature is between about 0.1 V and about 40 V. The channel substrate comprises a source region, a drain region, and a gate region disposed therebetween. This disclosure also provides devices comprising these tunneling channels and a source electrode at the source region, a drain electrode at the drain region, and a gate electrode at the gate region. This disclosure also provides oriented arrays comprising a plurality of these tunneling channels or devices.

This disclosure also provides a method of making a tunneling channel of a field effect transistor, the method comprising contacting a channel substrate with a plurality of tunneling elements. Contacting a channel substrate with a plurality of tunneling elements comprises depositing a thin film on to the channel substrate, and annealing or etching the thin film to produce quantum dots. This disclosure also provides a method of making oriented arrays, the method comprising orienting a plurality of these tunnel channels or devices on a macrosubstrate.

Other aspect of the invention will become apparent by consideration of the detailed description and accompanying drawings.

BRIEF DESCRIPTION OF THE DRAWINGS

FIGS. 1A and 1B are block diagrams generally showing tunneling channels according to this disclosure. Note: Tunneling elements are represented as evenly spaced and equal diameter for ease of presentation, and this is not intended to indicate that the elements are evenly spaced or equal diameter.

FIG. 2 is a schematic representation generally showing devices according to this disclosure.

FIG. 4A is a scanning electron microscopy (SEM) image and FIGS. 4B and 4C are scanning transmission electron microscopy (STEM) images.

FIG. 8 contains SEM images of tunneling channels according to this disclosure as contacted by two scanning tunneling microscopy (STM) probes at various tunneling channel lengths. The STM tips are separated by 2.37 μm (FIG. 8A), 2.06 μm (FIG. 8B), 1.73 μm (FIG. 8C) and 1.29 μm (FIG. 8D).

DETAILED DESCRIPTION

Figure 2A:
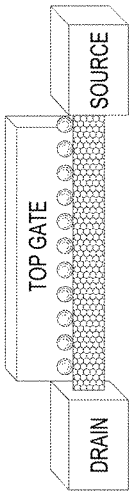
FIG. 2A shows a schematic of a device without a gate electrode.
Figure 2B:
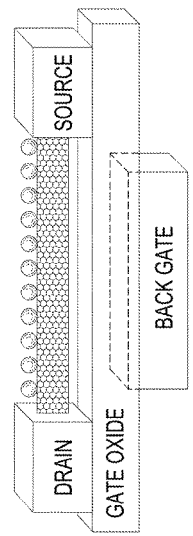
FIGS. 2B, 2C and 2D show a schematic of a device with a gate electrode oriented in the top-gate, side-gate and back-gate configurations, respectively. Note: Tunneling elements are represented as evenly spaced and equal diameter for ease of presentation, and this is not intended to indicate that the elements are evenly spaced or equal diameter.
Figure 2C:
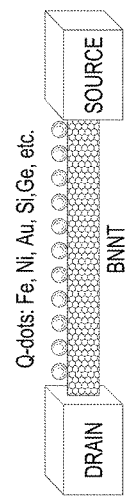
Figure 2D:
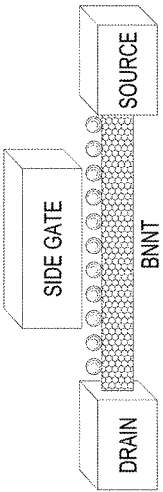
Figure 3:
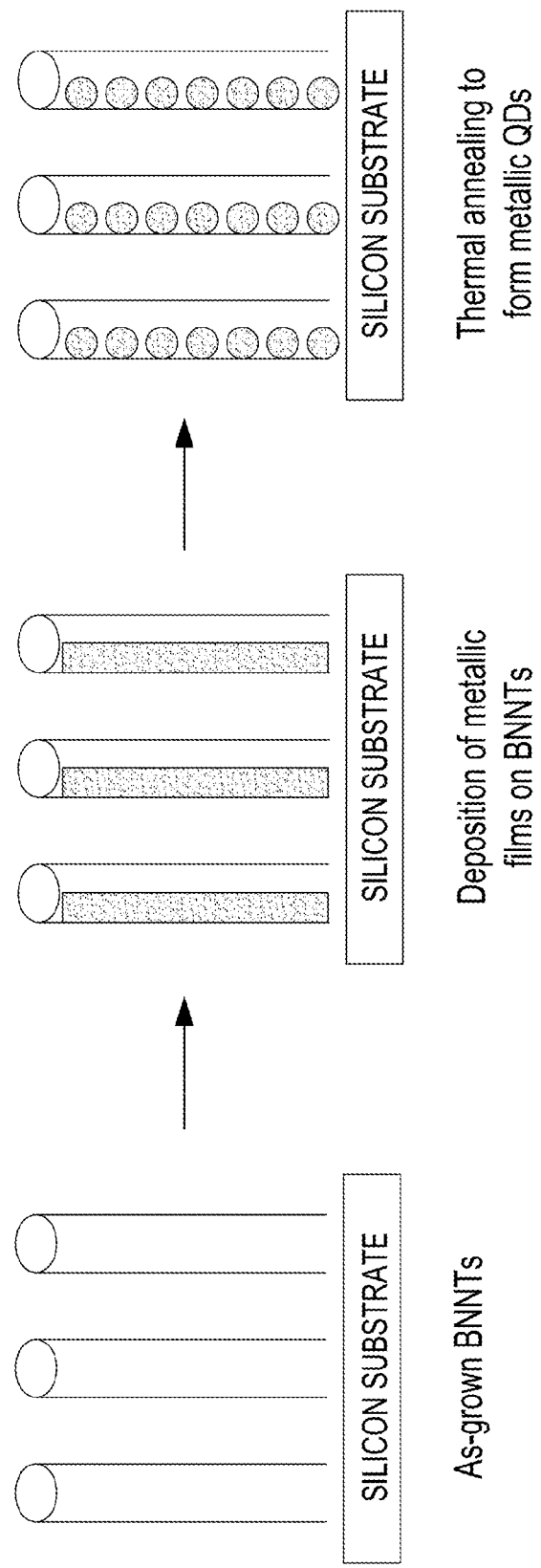
FIG. 3 is a schematic representation generally showing the method of making tunneling channels according to this disclosure. Note: Tunneling elements are represented as evenly spaced and equal diameter for ease of presentation, and this is not intended to indicate that the elements are evenly spaced or equal diameter.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

It also is understood that any numerical range recited herein includes all values from the lower value to the upper value. For example, if a concentration range is stated as 1% to 50%, it is intended that values such as 2% to 40%, 10% to 30%, or 1% to 3%, etc., are expressly enumerated in this specification. These are only examples of what is specifically intended, and all possible combinations of numerical values between and including the lowest value and the highest value enumerated are to be considered to be expressly stated in this application.

As used herein, the term "about" is used synonymously with the term "approximately." Illustratively, the use of the term "about" indicates that a recited value may include additional values slightly outside the recited values. This variation may be due to conditions such as experimental error, manufacturing tolerances, variations in equilibrium conditions, and the like. In some embodiments, the term "about" may include the cited value plus or minus 2.5%, 5%, 7.5%, or 10%, among others.

As used herein, the term "room temperature" means the temperature of the air in a generally temperature controlled space. Room temperature refers to a temperature of between about 20° C. and about 30° C.

This disclosure provides tunneling channels of a field effect transistor, devices comprising said channels, oriented arrays comprising said channels or devices, and methods of making said channels, devices and arrays, as described in detail below.

I. Tunneling Channel of a Field Effect Transistor

The tunneling channels 10 of a field effect transistor disclosed herein may comprise a plurality 20 of tunneling elements 22 contacting a channel substrate 30.

In some embodiments, applying a source-drain voltage of greater than a turn-on voltage may produce a source-drain current of at least about 0.1 pA, at least about 0.2 pA, at least about 0.3 pA, at least about 0.4 pA, at least about 0.5 pA, at least about 0.6 pA, at least about 0.7 pA, at least about 0.8 pA, at least about 0.9 pA, at least about 1 pA, at least about 2 pA, at least about 3 pA, at least about 4 pA, at least about 5 pA, at least about 6 pA, at least about 7 pA, at least about 8 pA, at least about 9 pA, at least about 10 pA, at least about 11 pA, at least about 12 pA, at least about 13 pA, at least about 14 pA, at least about 15 pA, at least about 16 pA, at least about 17 pA, at least about 18 pA, at least about 19 pA, at least about 20 pA, at least about 25 pA, at least about 30 pA, at least about 35 pA, at least about 40 pA, at least about 45 pA, at least about 50 pA, at least about 75 pA, at least about 100 pA, or at least about 1 nA. In some embodiments, applying a source-drain voltage of greater than a turn-on voltage at room temperature may produce a source-drain current of at least about 0.1 pA, at least about 0.2 pA, at least about 0.3 pA, at least about 0.4 pA, at least about 0.5 pA, at least about 0.6 pA, at least about 0.7 pA, at least about 0.8 pA, at least about 0.9 pA, at least about 1 pA, at least about 2 pA, at least about 3 pA, at least about 4 pA, at least about 5 pA, at least about 6 pA, at least about 7 pA, at least about 8 pA, at least about 9 pA, at least about 10 pA, at least about 11 pA, at least about 12 pA, at least about 13 pA, at least about 14 pA, at least about 15 pA, at least about 16 pA, at least about 17 pA, at least about 18 pA, at least about 19 pA, at least about 20 pA, at least about 25 pA, at least about 30 pA, at least about 35 pA, at least about 40 pA, at least about 45 pA, at least about 50 pA, at least about 75 pA, at least about 100 pA, or at least about 1 nA.

In some embodiments, applying a source-drain voltage of less than a turn-on voltage may produce a source-drain current of at most about 0.1 pA, at most about 0.2 pA, at most about 0.3 pA, at most about 0.4 pA, at most about 0.5 pA, at most about 0.6 pA, at most about 0.7 pA, at most about 0.8 pA, at most about 0.9 pA, at most about 1 pA, at most about 2 pA, at most about 3 pA, at most about 4 pA, at most about 5 pA, at most about 6 pA, at most about 7 pA, at most about 8 pA, at most about 9 pA, at most about 10 pA, at most about 11 pA, at most about 12 pA, at most about 13 pA, at most about 14 pA, at most about 15 pA, at most about 16 pA, at most about 17 pA, at most about 18 pA, at most about 19 pA, at most about 20 pA, at most about 25 pA, at most about 30 pA, at most about 35 pA, at most about 40 pA, at most about 45 pA, at most about 50 pA, at most about 75 pA, at most about 100 pA, or at most about 1 nA. In some embodiments, applying a source-drain voltage of less than a turn-on voltage at room temperature may produce a source-drain current of at most about 0.1 pA, at most about 0.2 pA, at most about 0.3 pA, at most about 0.4 pA, at most about 0.5 pA, at most about 0.6 pA, at most about 0.7 pA, at most about 0.8 pA, at most about 0.9 pA, at most about 1 pA, at most about 2 pA, at most about 3 pA, at most about 4 pA, at most about 5 pA, at most about 6 pA, at most about 7 pA, at most about 8 pA, at most about 9 pA, at most about 10 pA, at most about 11 pA, at most about 12 pA, at most about 13 pA, at most about 14 pA, at most about 15 pA, at most about 16 pA, at most about 17 pA, at most about 18 pA, at most about 19 pA, at most about 20 pA, at most about 25 pA, at most about 30 pA, at most about 35 pA, at most about 40 pA, at most about 45 pA, at most about 50 pA, at most about 75 pA, at most about 100 pA, or at most about 1 nA.

In some embodiments, the turn-on voltage at room temperature may be at least about 0.001 V, at least about 0.005 V, at least about 0.01 V, at least about 0.02 V, at least about 0.03 V, at least about 0.04 V, at least about 0.05 V, at least about 0.06 V, at least about 0.07 V, at least about 0.08 V, at least about 0.09 V, at least about 0.1 V, at least about 0.2 V, at least about 0.3 V, at least about 0.4 V, at least about 0.5 V, at least about 0.6 V, at least about 0.7 V, at least about 0.8 V, at least about 0.9 V, at least about 1 V, at least about 2 V, at least about 3 V, at least about 4 V, at least about 5 V, at least about 6 V, at least about 7 V, at least about 8 V, at least about 9 V, at least about 10 V, at least about 15 V, at least about 20 V, at least about 25 V, at least about 30 V, or at least about 35 V. In some embodiments, the turn-on voltage at room temperature may be at most about 40 V, at most about 39 V, at most about 38 V, at most about 37 V, at most about 36 V, at most about 35 V, at most about 34 V, at most about 33 V, at most about 32 V, at most about 31 V, at most about 30 V, at most about 25 V, at most about 20 V, at most about 15 V, at most about 10 V, at most about 9 V, at most about 8 V, at most about 7 V, at most about 6 V, at most about 5 V, at most about 4 V, at most about 3 V, at most about 2, or at most about 1 V. This includes embodiments where the turn-on voltage at room temperature may be from about 0.1 V to about 40 V, such as from about 0.2 V to about 30 V, and about 1 V to about 10 V.

In some embodiments, the turn-on voltage may be reduced by at least about 1%, at least about 2%, at least about 3%, at least about 4%, at least about 5%, at least about 6%, at least about 7%, at least about 8%, at least about 9%, at least about 10%, at least about 11%, at least about 12%, at least about 13%, at least about 14%, at least about 15%, at least about 16%, at least about 17%, at least about 18%, at least about 19%, at least about 20%, at least about 25%, at least about 30%, at least about 35%, at least about 40%, at least about 45%, at least about 50%, at least about 55%, at least about 60%, at least about 65%, at least about 70%, at least about 75%, at least about 80%, at least about 85%, at least about 90%, at least about 95%, or at least about 99%. In some embodiments, the turn-on voltage may be reduced by applying a gate voltage of at least about ±0.1 V, at least about ±0.2 V, at least about ±0.3 V, at least about ±0.4 V, at least about ±0.5 V, at least about ±0.6 V, at least about ±0.7 V, at least about ±0.8 V, at least about ±0.9 V, at least about ±1 V, at least about ±2 V, at least about ±3 V, at least about ±4 V, at least about ±5 V, at least about ±6 V, at least about ±7 V, at least about ±8 V, at least about ±9 V, at least about ±10 V, at least about ±15 V, at least about ±20 V, at least about ±25 V, at least about ±30 V, at least about ±35 V, or at least about ±40 V. In some embodiments, the turn-on voltage may be reduced by applying an external magnetic field of at least about 0.01 T, at least about 0.02 T, at least about 0.03 T, at least about 0.04 T, at least about 0.05 T, at least about 0.06 T, at least about 0.07 T, at least about 0.08 T, at least about 0.09 T, at least about 0.1 T, at least about 0.2 T, at least about 0.3 T, at least about 0.4 T, at least about 0.5 T, at least about 0.6 T, at least about 0.7 T, at least about 0.8 T, at least about 0.9 T, at least about 1 T, at least about 2 T, at least about 3 T, at least about 4 T, at least about 5 T, at least about 6 T, at least about 7 T, at least about 8 T, at least about 9 T, at least about 10 T, at least about 15 T, at least about 20 T, at least about 25 T, at least about 30 T, at least about 35 T, at least about 40 T, at least about 45 T, or at least about 50 T. In some embodiments, the turn-on voltage may be reduced by generating plasmonic waves in the plurality of tunneling elements.

In some embodiments, the tunneling channel may exhibit current leakage of at most about 100 nA, at most about 50 nA, at most about 10 nA, at most about 9 nA, at most about 8 nA, at most about 7 nA, at most about 6 nA, at most about 5 nA, at most about 4 nA, at most about 3 nA, at most about 2 nA, at most about 1 nA, at most about 0.9 nA, at most about 0.8 nA, at most about 0.7 nA, at most about 0.6 nA, at most about 0.5 nA, at most about 0.4 nA, at most about 0.3 nA, at most about 0.2 nA, at most about 0.1 nA, at most about 90 pA, at most about 80 pA, at most about 70 pA, at most about 60 pA, at most about 50 pA, at most about 40 pA, at most about 30 pA, at most about 20 pA, at most about 10 pA, at most about 9 pA, at most about 8 pA, at most about 7 pA, at most about 6 pA, at most about 5 pA, at most about 4 pA, at most about 3 pA, at most about 2 pA, or at most about 1 pA.

In some embodiments, the tunneling channel may comprise a longest dimension of at most about 500 μm, at most about 400 μm, at most about 300 μm, at most about 200 μm, at most about 100 μm, at most about 90 μm, at most about 80 μm, at most about 70 μm, at most about 60 μm, at most about 50 μm, at most about 40 μm, at most about 30 μm, at most about 20 μm, at most about 10 μm, at most about 9 μm, at most about 8 μm, at most about 7 μm, at most about 6 μm, at most about 5 μm, at most about 4 μm, at most about 3 μm, at most about 2 μm, at most about 1 μm, at most about 0.9 μm, at most about 0.8 μm, at most about 0.7 μm, at most about 0.6 μm, at most about 0.5 μm, at most about 0.4 μm, at most about 0.3 μm, at most about 0.2 μm, at most about 0.1 μm, at most about 90 nm, at most about 80 nm, at most about 70 nm, at most about 60 nm, at most about 50 nm, at most about 40 nm, at most about 30 nm, or at most about 20 nm.

In some embodiments, the tunneling channel may comprise a second dimension orthogonal to the longest dimension of at most about 500 μm, at most about 400 μm, at most about 300 μm, at most about 200 μm, at most about 100 μm, at most about 90 μm, at most about 80 μm, at most about 70 μm, at most about 60 μm, at most about 50 μm, at most about 40 μm, at most about 30 μm, at most about 20 μm, at most about 10 μm, at most about 9 μm, at most about 8 μm, at most about 7 μm, at most about 6 μm, at most about 5 μm, at most about 4 μm, at most about 3 μm, at most about 2 μm, at most about 1 μm, at most about 0.9 μm, at most about 0.8 μm, at most about 0.7 μm, at most about 0.6 μm, at most about 0.5 μm, at most about 0.4 μm, at most about 0.3 μm, at most about 0.2 μm, at most about 0.1 μm, at most about 90 nm, at most about 80 nm, at most about 70 nm, at most about 60 nm, at most about 50 nm, at most about 40 nm, at most about 30 nm, or at most about 20 nm.

In some embodiments, the tunneling channel may comprise a shortest dimension orthogonal to the longest dimension and the second dimension of at most about 500 μm, at most about 400 μm, at most about 300 μm, at most about 200 μm, at most about 100 μm, at most about 90 μm, at most about 80 μm, at most about 70 μm, at most about 60 μm, at most about 50 μm, at most about 40 μm, at most about 30 μm, at most about 20 μm, at most about 10 μm, at most about 9 μm, at most about 8 μm, at most about 7 μm, at most about 6 μm, at most about 5 μm, at most about 4 μm, at most about 3 μm, at most about 2 μm, at most about 1 μm, at most about 0.9 μm, at most about 0.8 μm, at most about 0.7 μm, at most about 0.6 μm, at most about 0.5 μm, at most about 0.4 μm, at most about 0.3 μm, at most about 0.2 μm, at most about 0.1 μm, at most about 90 nm, at most about 80 nm, at most about 70 nm, at most about 60 nm, at most about 50 nm, at most about 40 nm, at most about 30 nm, or at most about 20 nm.

Without being limited by theory, it is believed that shorter tunneling channels have a lower turn-on voltage ($V_{on}$) than longer tunneling channels. Therefore, it is also believed that $V_{on}$ can be reduced by having a shorter channel length and increased by having a longer channel length.

In particularly preferred embodiments, the tunneling channel may function in a field effect transistor at room temperature.

A. Tunneling Element

Suitable tunneling elements 22 may be of any materials or physical dimensions that provide the desired electronic properties when contacting the channel substrate disclosed herein. All that is required is an ability to donate and receive electrons via a tunnel barrier.

In some embodiments, the tunneling element may comprise a material selected from the group consisting of metal, doped semiconductors, graphene, carbon nanotubes, superconductors, conductive molecules, and combinations thereof.

In some embodiments, the tunneling element may comprise a material selected from the group consisting of Au, Ag, Al, Fe, Ni, Mo, doped Si, doped Ge, doped BN, doped AlN, doped GaN, doped GaP, doped InP, doped GaAs, doped InAs, doped ZnO, doped ZnS, doped InAs, and combinations thereof. In particularly preferred embodiments, the tunneling element may comprise a material selected from the group consisting of Au, Fe, or combinations thereof.

In some embodiments, the tunneling element may comprise a ferromagnetic or magnetic material.

In some embodiments, the tunneling element may be a quantum dot.

Suitable pluralities 20 of tunneling elements 22 may be of any materials or physical dimensions that provide the desired electronic properties when contacting the channel substrate 30 disclosed herein.

In some embodiments, the plurality of tunneling elements may comprise an average spacing between elements of at least about 0.2 nm, at least about 0.3 nm, at least about 0.4 nm, at least about 0.5 nm, at least about 0.6 nm, at least about 0.7 nm, at least about 0.8 nm, at least about 0.9 nm, at least about 1.0 nm, at least about 1.2 nm, at least about 1.4 nm, at least about 1.6 nm, at least about 1.8 nm, at least about 2.0 nm, at least about 2.2 nm, at least about 2.4 nm, at least about 2.6 nm, at least about 2.8 nm, at least about 3.0 nm, at least about 3.2 nm, at least about 3.4 nm, at least about 3.6 nm, at least about 3.8 nm, at least about 4.0 nm, at least about 4.2 nm, at least about 4.4 nm, at least about 4.6 nm, at least about 4.8 nm, at least about 5.0 nm, at least about 5.2 nm, at least about 5.4 nm, at least about 5.6 nm, at least about 5.8 nm, at least about 6.0 nm, at least about 6.2 nm, at least about 6.4 nm, at least about 6.6 nm, at least about 6.8 nm, at least about 7.0 nm, at least about 7.2 nm, at least about 7.4 nm, at least about 7.6 nm, at least about 7.8 nm, at least about 8.0 nm, at least about 8.2 nm, at least about 8.4 nm, at least about 8.6 nm, at least about 8.8 nm, at least about 9.0 nm, at least about 9.2 nm, at least about 9.4 nm, at least about 9.6 nm, at least about 9.8 nm, at least about 10 nm, at least about 10.5 nm, at least about 11 nm, at least about 11.5 nm, at least about 12 nm, at least about 12.5 nm, at least about 13 nm, at least about 13.5 nm, at least about 14 nm, at least about 14.5 nm, at least about 15 nm, at least about 20 nm, at least about 25 nm, at least about 30 nm, at least about 35 nm, at least about 40 nm, or at least about 45 nm. In some embodiments, the plurality of tunneling elements may comprise an average spacing between elements of at most about 50 nm, at most about 45 nm, at most about 40 nm, at most about 35 nm, at most about 30 nm, at most about 25 nm, at most about 20 nm, at most about 19 nm, at most about 18 nm, at most about 17 nm, at most about 16 nm, at most about 15 nm, at most about 14.5 nm, at most about 14 nm, at most about 13.5 nm, at most about 13 nm, at most about 12.5 nm, at most about 12 nm, at most about 11.5 nm, at most about 11 nm, at most about 10.5 nm, at most about 10 nm, at most about 9.5 nm, at most about 9 nm, at most about 8.5 nm, at most about 8 nm, at most about 7.5 nm, at most about 7 nm, at most about 6.5 nm, at most about 6 nm, at most about 5.5 nm, at most about 5 nm, at most about 4.5 nm, at most about 4 nm, at most about 3.5 nm, at most about 3 nm, at most about 2.5 nm, at most about 2 nm, or at most about 1 nm. This includes embodiments where the plurality of tunneling elements may comprise an average spacing between elements from about 0.2 nm to about 50 nm, such as from about 0.5 nm to about 30 nm, and from about 1 nm to about 15 nm.

In some embodiments, the plurality of tunneling elements may be unevenly spaced. In some embodiments, the plurality of tunneling elements may be irregularly spaced. In some embodiments, the plurality of tunneling elements may be randomly spaced. In some embodiments, the plurality of tunneling elements may comprise a distribution of spacing between elements with a standard deviation of at least about 0.1 nm, at least about 0.2 nm, at least about 0.3 nm, at least about 0.4 nm, at least about 0.5 nm, at least about 0.6 nm, at least about 0.7 nm, at least about 0.8 nm, at least about 0.9 nm, at least about 1.0 nm, at least about 2 nm, at least about 3 nm, at least about 4 nm, at least about 5 nm, at least about 6 nm, at least about 7 nm, at least about 8 nm, at least about 9 nm, at least about 10 nm, at least about 15 nm, at least about 20 nm, or at least about 30 nm.

In some embodiments, the plurality of tunneling elements may comprise an average element diameter of at least about 1 nm, at least about 2 nm, at least about 3 nm, at least about 4 nm, at least about 5 nm, at least about 6 nm, at least about 7 nm, at least about 8 nm, at least about 9 nm, at least about 10 nm, at least about 11 nm, at least about 12 nm, at least about 13 nm, at least about 14 nm, at least about 15 nm, at least about 16 nm, at least about 17 nm, at least about 18 nm, at least about 19 nm, at least about 20 nm, at least about 21 nm, at least about 22 nm, at least about 23 nm, at least about 24 nm, at least about 25 nm, at least about 26 nm, at least about 27 nm, at least about 28 nm, at least about 29 nm, at least about 30 nm, at least about 31 nm, at least about 32 nm, at least about 33 nm, at least about 34 nm, at least about 35 nm, at least about 36 nm, at least about 37 nm, at least about 38 nm, at least about 39 nm, at least about 40 nm, at least about 41 nm, at least about 42 nm, at least about 43 nm, at least about 44 nm, at least about 45 nm, at least about 46 nm, at least about 47 nm, at least about 48 nm, at least about 49 nm, at least about 50 nm, at least about 55 nm, at least about 60 nm, at least about 65 nm, at least about 70 nm, at least about 75 nm, at least about 80 nm, at least about 85 nm, at least about 90 nm, at least about 95 nm, at least about 100 nm, at least about 125 nm, at least about 150 nm, at least about 175 nm, at least about 200 nm, at least about 225 nm, at least about 250 nm, at least about 275 nm, at least about 300 nm, at least about 400 nm, or at least about 500 nm. In some embodiments, the plurality of tunneling elements may comprise an average element diameter of at most about 1 µm, at most about 750 nm, at most about 500 nm, at most about 250 nm, at most about 225 nm, at most about 200 nm, at most about 175 nm, at most about 150 nm, at most about 125 nm, at most about 100 nm, at most about 90 nm, at most about 80 nm, at most about 70 nm, at most about 60 nm, at most about 50 nm, at most about 49 nm, at most about 48 nm, at most about 47 nm, at most about 46 nm, at most about 45 nm, at most about 44 nm, at most about 43 nm, at most about 42 nm, at most about 41 nm, at most about 40 nm, at most about 39 nm, at most about 38 nm, at most about 37 nm, at most about 36 nm, at most about 35 nm, at most about 34 nm, at most about 33 nm, at most about 32 nm, at most about 31 nm, at most about 30 nm, at most about 29 nm, at most about 28 nm, at most about 27 nm, at most about 26 nm, at most about 25 nm, at most about 24 nm, at most about 23 nm, at most about 22 nm, at most about 21 nm, at most about 20 nm, at most about 19 nm, at most about 18 nm, at most about 17 nm, at most about 16 nm, at most about 15 nm, at most about 14 nm, at most about 13 nm, at most about 12 nm, at most about 11 nm, at most about 10 nm, at most about 9 nm, at most about 8 nm, at most about 7 nm, at most about 6 nm, or at most about 5 nm. This includes embodiments where the plurality of tunneling elements may comprise an average element diameter from about 0.5 nm to about 1 µm, such as from about 1 nm to about 500 nm, and from about 1 nm to about 50 nm.

In some embodiments, the plurality of tunneling elements may be unevenly sized. In some embodiments, the plurality of tunneling elements may be irregularly sized. In some embodiments, the plurality of tunneling elements may be randomly sized. In some embodiments, the plurality of tunneling elements may comprise a distribution of spacing between elements with a standard deviation of at least about 0.1 nm, at least about 0.2 nm, at least about 0.3 nm, at least about 0.4 nm, at least about 0.5 nm, at least about 0.6 nm, at least about 0.7 nm, at least about 0.8 nm, at least about 0.9 nm, at least about 1.0 nm, at least about 2 nm, at least about 3 nm, at least about 4 nm, at least about 5 nm, at least about 6 nm, at least about 7 nm, at least about 8 nm, at least about 9 nm, at least about 10 nm, at least about 15 nm, at least about 20 nm, at least about 25 nm, at least about 50 nm, at least about 75 nm, or at least about 100 nm.

In preferred embodiments, the plurality of tunneling elements does not require insulation from the atmosphere. In some embodiments, the plurality of tunneling elements is capable of being contacted by a fluid. In some embodiments, the plurality of tunneling elements is capable of being contacted by a solid.

Without being limited by theory, it is believed that the spacing between tunneling elements affects the electronic properties of the tunneling channel. Without being limited by theory, it is believed that larger spacing between tunneling elements correlates to an increased turn-on voltage. Without being limited by theory, it is believed that smaller spacing between tunneling elements correlates to a decreased turn-on voltage, and if the spacing is small enough, it leads to a channel with conductive properties at room temperature.

Without being limited by theory, it is believed that a smaller diameter of tunneling elements correlates to an increased turn-on voltage. Without being limited by theory, it is believed that larger diameter of tunneling elements correlates to a decreased turn-on voltage, at least because the spacing between elements naturally is reduced as the diameter of the elements is increased, and if the diameter is large enough (for example, when adjacent elements fuse with one another), it leads to a channel with conductive properties.

Without being limited by theory, it is believed that uneven, irregular or random spacing of tunneling elements contributes to the ability of the tunneling channels to function at room temperature.

B. Channel Substrate

Suitable channel substrates 30 may be of any material or physical dimension that provides the desired electronic properties when contacting the plurality of tunneling elements disclosed herein.

In some embodiments, the channel substrate may comprise an electronically-insulating material.

In some embodiments, the channel substrate may be essentially one-dimensional. In some embodiments, the channel substrate may comprise a nanotube, a nanowire, a nanofiber, a nanorod, or a combination thereof.

In some embodiments, the channel substrate may be essentially two-dimensional or three-dimensional.

In some embodiments, the channel substrate 30 may comprise a source region 32, a drain region 34, and a gate region 36 disposed therebetween.

In some embodiments, the channel substrate may comprise a material selected from the group consisting of insulating semiconductors, oxides, nitrides, glasses, insulating polymers, and combinations thereof.

In some embodiments, the channel substrate may comprise an insulating material selected from the group consisting of group IV elemental semiconductors, group IV compound semiconductors, III-V semiconductors, II-VI semiconductors, I-VII semiconductors, IV-VI semiconductors, V-VI semiconductors, II-V semiconductors, oxides, layered semiconductors, magnetic semiconductors, organic semiconductors, charge-transfer complexes, and combinations thereof. In some embodiments, the channel substrate may comprise an insulating material selected from the group consisting of carbon, including diamond; silicon; germanium (Ge); silicon carbide (SiC), including 3C—SiC, 4H—SiC and 6H—SiC; silicon-germanium (SiGe); aluminum antimonide (AlSb); aluminum arsenide (AlAs); aluminum nitride (AlN); aluminum phosphide (AlP); boron nitride (BN), including cubic, hexagonal and nanotube; boron phosphide (BP); boron arsenide (BAs), including BAs and $B_{12}As_2$; gallium antimonide (GaSb); gallium arsenide (GaAs); gallium nitride (GaN); gallium phosphide (GaP); indium antimonide (InSb); indium arsenide (InAs); indium nitride (InN); indium phosphide (InP); aluminum gallium arsenide (AlGaAs); indium gallium arsenide (InGaAs); indium gallium phosphide (InGaP); aluminum indium arsenide (AlInAs); aluminum indium antimonide (AlInSb); gallium arsenide nitride (GaAsN); gallium arsenide phosphide (GaAsP); gallium arsenide antimonide (GaAsSb); aluminum gallium nitride (AlGaN); aluminum gallium phosphide (AlGaP); indium gallium nitride (InGaN); indium arsenide antimonide (InAsSb); indium gallium antimonide (InGaSb); aluminum gallium indium phosphide (AlGaInP); aluminum gallium arsenide phosphide (AlGaAsP); indium gallium arsenide phosphide (InGaAsP); indium gallium arsenide antimonide (InGaAsSb); indium arsenide antimonide phosphide (InAsSbP); aluminum indium arsenide phosphide (AlInAsP); aluminum gallium arsenide nitride (AlGaAsN); indium gallium arsenide nitride (InGaAsN); indium aluminum arsenide nitride (InAlAsN); gallium arsenide antimonide nitride (GaAsSbN); gallium indium nitride arsenide antimonide (GaInNAsSb); gallium indium arsenide antimonide phosphide (GaInAsSbP); cadmium selenide (CdSe); cadmium sulfide (CdS); cadmium telluride (CdTe); zinc oxide (ZnO); zinc selenide (ZnSe); zinc sulfide (ZnS); zinc telluride (ZnTe); cadmium zinc telluride (CdZnTe); mercury cadmium telluride (HgCdTe); mercury zinc telluride (HgZnTe); mercury zinc selenide (HgZnSe); cuprous chloride (CuCl); titanium dioxide ($TiO_2$), including anatase, rutile and brookite; copper(I) oxide ($Cu_2O$); copper (II) oxide (CuO); uranium dioxide ($UO_2$); uranium trioxide ($UO_3$), bismuth trioxide ($Bi_2O_3$), tin dioxide ($SnO_2$), barium titanate ($BaTiO_3$), strontium titanate ($SrTiO_3$), lithium niobate ($LiNbO_3$); lanthanum copper oxide ($La_2CuO_4$); and combinations thereof.

In some embodiments, the channel substrate may comprise an insulating material selected from the group consisting of rubber, nylon, polystyrene, polyamides, polyethylene, polypropylene, polyvinyl chloride, polyvinyl butyral, silicone, epoxy resins, poly(methyl methacrylate), polydimethylsiloxane, and combinations thereof.

In one particularly preferred embodiment, the channel substrate may comprise a boron nitride nanotube.

In some embodiments, the channel substrate may be at least about 10 nm, at least about 15 nm, at least about 20 nm, at least about 25 nm, at least about 30 nm, at least about 40 nm, at least about 50 nm, at least about 60 nm, at least about 70 nm, at least about 80 nm, at least about 90 nm, at least about 100 nm, at least about 200 nm, at least about 300 nm, at least about 400 nm, at least about 500 nm, at least about 1 μm, at least about 2 μm, at least about 3 μm, at least about 4 μm, at least about 5 μm, at least about 6 μm, at least about 7 μm, at least about 8 μm, at least about 9 μm, at least about 10 μm, at least about 15 μm, at least about 20 μm, at least about 25 μm, at least about 30 μm, at least about 40 μm, at least about 50 μm, at least about 60 μm, at least about 70 μm, at least about 80 μm, at least about 90 μm, or at least about 100 μm in length. In some embodiments, the channel substrate may be at most about 500 μm, at most about 400 μm, at most about 300 μm, at most about 200 μm, at most about 100 μm, at most about 90 μm, at most about 80 μm, at most about 70 μm, at most about 60 μm, at most about 50 μm, at most about 40 μm, at most about 30 μm, at most about 25 μm, at most about 20 μm, at most about 15 μm, at most about 10 μm, at most about 9 μm, at most about 8 μm, at most about 7 μm, at most about 6 μm, at most about 5 μm, at most about 4 μm, at most about 3 μm, at most about 2 μm, at most about 1 μm, at most about 900 nm, at most about 800 nm, at most about 700 nm, at most about 600 nm, at most about 500 nm, at most about 400 nm, at most about 300 nm, at most about 200 nm, or at most about 100 nm in length.

Without being limited by theory, it is believed that the turn-on voltage is positively correlated with the length of the channel substrate, such that a longer channel substrate provides a tunneling channel with a higher turn-on voltage.

II. Devices

In addition to the tunneling channels described above, this disclosure provides devices that incorporate the tunneling channels described herein. This disclosure provides devices comprising a tunneling channel as described herein, a source electrode and a drain electrode. In some embodiments, the device further comprises a gate electrode. In some embodiments, the device further comprises a gate dielectric.

In preferred embodiments, the source electrode is at the source region and the drain electrode is at the drain region. In preferred embodiments, the gate electrode is at the gate region. In some embodiments, the gate dielectric is at the gate region.

In some embodiments, the source electrode, drain electrode and gate electrode may comprise materials independently selected from the group consisting of Au, Pt, Ag, Al, Ti, Fe, Co, Ni, Cu, Mo, Sn, Pd, Ag, W, steel, highly-doped Si, highly-doped Ge, conducting ZnO, conducting $TiO_2$, silicide (TiSi, MoSi, TaSi or WSi), carbon nanotubes, graphene, graphite, Indium Tin Oxide (ITO), Aluminum-doped ZnO (AZO), and combinations thereof.

In some embodiments, the gate dielectric may comprise a material selected from the group consisting of silicon oxide, germanium oxide, hafnium silicate, zirconium silicate, hafnium dioxide and zirconium dioxide In some embodiments, the gate electrode may be configured in the top gate configuration, the side gate configuration, the back gate configuration, or a combination thereof.

In some embodiments, the device may comprise a longest physical dimension of at most about 1 mm, at most about 500 μm, at most about 400 μm, at most about 300 μm, at most about 200 μm, at most about 100 μm, at most about 90 μm, at most about 80 μm, at most about 70 μm, at most about 60 µm, at most about 50 µm, at most about 40 µm, at most about 30 µm, at most about 20 µm, at most about 10 µm, at most about 9 µm, at most about 8 µm, at most about 7 µm, at most about 6 µm, at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, at most about 0.1 µm, at most about 90 nm, at most about 80 nm, at most about 70 nm, at most about 60 nm, at most about 50 nm, at most about 40 nm, at most about 30 nm, or at most about 20 nm.

In some embodiments, the device may comprise a second physical dimension orthogonal to the longest dimension of at most about 500 µm, at most about 400 µm, at most about 300 µm, at most about 200 µm, at most about 100 µm, at most about 90 µm, at most about 80 µm, at most about 70 µm, at most about 60 µm, at most about 50 µm, at most about 40 µm, at most about 30 µm, at most about 20 µm, at most about 10 µm, at most about 9 µm, at most about 8 µm, at most about 7 µm, at most about 6 µm, at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, at most about 0.1 µm, at most about 90 nm, at most about 80 nm, at most about 70 nm, at most about 60 nm, at most about 50 nm, at most about 40 nm, at most about 30 nm, or at most about 20 nm.

In some embodiments, the device may comprise a shortest physical dimension orthogonal to the longest dimension and the second dimension of at most about 500 µm, at most about 400 µm, at most about 300 µm, at most about 200 µm, at most about 100 µm, at most about 90 µm, at most about 80 µm, at most about 70 µm, at most about 60 µm, at most about 50 µm, at most about 40 µm, at most about 30 µm, at most about 20 µm, at most about 10 µm, at most about 9 µm, at most about 8 µm, at most about 7 µm, at most about 6 µm, at most about 5 µm, at most about 4 µm, at most about 3 µm, at most about 2 µm, at most about 1 µm, at most about 0.9 µm, at most about 0.8 µm, at most about 0.7 µm, at most about 0.6 µm, at most about 0.5 µm, at most about 0.4 µm, at most about 0.3 µm, at most about 0.2 µm, at most about 0.1 µm, at most about 90 nm, at most about 80 nm, at most about 70 nm, at most about 60 nm, at most about 50 nm, at most about 40 nm, at most about 30 nm, or at most about 20 nm.

III. Arrays

In addition to the tunneling channels and devices described above, this disclosure also provides oriented arrays comprising a plurality of the tunneling channel described herein or a plurality of the device described herein oriented on a macrosubstrate.

Suitable macrosubstrates are known to one of skill in the art, and include any substrate that is typically used in electronic applications. In some embodiments, the macrosubstrate may comprise a semiconductor, including Si, Ge, GaAs, GaP, GaN, InP, InAs, SiC, CdSe, CdTe, ZnO, ZnS, ZnSe, ZnTe, InSb, and combinations thereof. In some embodiments, the macrosubstrate may comprise an insulator, including glass, plastic/polymer sheets, sapphire, pyrex, fuse silica, quartz, and combinations thereof. In preferred embodiments, the macrosubstrate may comprise a clean oxidized Si surface.

The array may be of any physical size that is typical for electronic components.

IV. Methods

In addition to the tunneling channels, devices and arrays described above, this disclosure also provides methods of making the tunneling channels, devices and arrays disclosed herein.

A. Method of Making a Tunneling Channel

This disclosure provides methods of making a tunneling channel of a field effect transistor, the method comprising contacting a channel substrate with a plurality of tunneling elements.

In some embodiments, contacting a channel substrate with a plurality of tunneling elements comprises depositing a thin film on to the channel substrate, and annealing or etching the thin film to produce quantum dots. In some embodiments, depositing a thin film on to the channel substrate comprises physical vapor deposition techniques, chemical vapor deposition techniques, solution-based deposition techniques, or a combination thereof.

Suitable materials for the thin film include any materials disclosed herein as suitable for tunneling elements.

In some embodiments, the thin film may have thickness of at least about 0.1 nm, at least about 0.2 nm, at least about 0.3 nm, at least about 0.4 nm, at least about 0.5 nm, at least about 0.6 nm, at least about 0.7 nm, at least about 0.8 nm, at least about 0.9 nm, at least about 1.0 nm, at least about 2 nm, at least about 3 nm, at least about 4 nm, at least about 5 nm, at least about 6 nm, at least about 7 nm, at least about 8 nm, at least about 9 nm, at least about 10 nm, at least about 11 nm, at least about 12 nm, at least about 13 nm, at least about 14 nm, at least about 15 nm, at least about 20 nm, at least about 25 nm, at least about 30 nm, at least about 35 nm, at least about 40 nm, or at least about 45 nm. In some embodiments, the thin film may have thickness of at most about 50 nm, at most about 45 nm, at most about 40 nm, at most about 35 nm, at most about 30 nm, at most about 25 nm, at most about 20 nm, at most about 19 nm, at most about 18 nm, at most about 17 nm, at most about 16 nm, at most about 15 nm, at most about 14 nm, at most about 13 nm, at most about 12 nm, at most about 10 nm, at most about 9 nm, at most about 8 nm, at most about 7 nm, at most about 6 nm, at most about 5 nm, at most about 4 nm, at most about 3 nm, at most about 2 nm, or at most about 1.0 nm. This includes embodiments where the film may have thickness of from about 0.1 nm to about 50 nm, such as from about 0.2 nm to about 20 nm, and from about 1 nm to about 10 nm.

In some embodiments, the physical vapor deposition techniques are selected from the group consisting of sputtering, electron beam evaporation, and combinations thereof. In some embodiments, the chemical vapor deposition techniques are selected from the group consisting of atomic layer deposition, plasma-enhanced chemical vapor deposition, and combinations thereof. In some embodiments, the solution-based deposition techniques are selected from the group consisting of self-assembly, functionalization-induced self-assembly, and combinations thereof.

In preferred embodiments, the depositing and the annealing or etching combine to produce quantum dots with the properties described herein.

B. Method of Making Devices

This disclosure provides methods of making devices comprising the tunneling channel of the present invention. Means of electronically coupling the electrodes to the tunneling channel of the present invention will be readily apparent to one of skill in the art.

In one embodiment, the method comprises orienting a source electrode at the source region and orienting a drain electrode at the drain region. In one embodiment, the method comprises orienting a gate electrode and an optional gate dielectric at the gate region.

C. Method of Making Oriented Arrays

This disclosure provides methods of making oriented arrays, the method comprising orienting a plurality of the tunneling channel of the present invention or the device of the present invention on a macrosubstrate.

In some embodiments, orienting comprises suspending a plurality of the tunneling channel or device of the present invention in a liquid and spin-coating, stamping, printing or transferring the plurality of the tunneling channel or device onto the macrosubstrate.

In some embodiments, orienting comprises pressing the plurality of the tunneling channel or device of the present invention onto the macrosubstrate and dragging across the macro substrate.

In some embodiments, pressing the plurality of the tunneling channel or device of the present invention onto the macrosubstrate occurs with a force equivalent to a load of at most about 1 kg, at most about 900 g, at most about 800 g, at most about 700 g, at most about 600 g, at most about 500 g, at most about 400 g, at most about 300 g, at most about 200 g, at most about 100 g, at most about 90 g, at most about 80 g, at most about 70 g, at most about 60 g, at most about 50 g, at most about 40 g, at most about 30 g, at most about 20 g, or at most about 10 g. In some embodiment, pressing the plurality of the tunneling channel of device of the present invention onto the macrosubstrate occurs with a force equivalent to a load of at least about 1 g, at least about 2 g, at least about 3 g, at least about 4 g, at least about 5 g, at least about 6 g, at least about 7 g, at least about 8 g, at least about 9 g, at least about 10 g, at least about 15 g, at least about 20 g, at least about 25 g, at least about 30 g, at least about 35 g, at least about 40 g, at least about 45 g, at least about 50 g, at least about 55 g, at least about 60 g, at least about 65 g, at least about 70 g, at least about 75 g, at least about 80 g, at least about 85 g, at least about 90 g, at least about 95 g, at least about 100 g, at least about 200 g, at least about 300 g, at least about 400 g, or at least about 500 g.

D. Methods of Using a Tunneling Channel, Device or Array

One of skill in the art would recognize a variety of applications for the tunneling channels, the devices, and the oriented arrays as described herein. In principle, the tunneling channels, devices and oriented arrays of the present invention can be deployed wherever one of skill in the art would deploy a FET of small physical dimensions that functions at room temperature.

This disclosure provides a basic logic gate comprising the tunneling channel, the device, or the oriented array as described herein.

In some embodiments, the logic operator is selected from the group consisting of AND, OR, XOR, NOT, NAND, NOR, XNOR, and combinations thereof.

EXAMPLES

Example 1

Tunneling Channel

Figure 4:
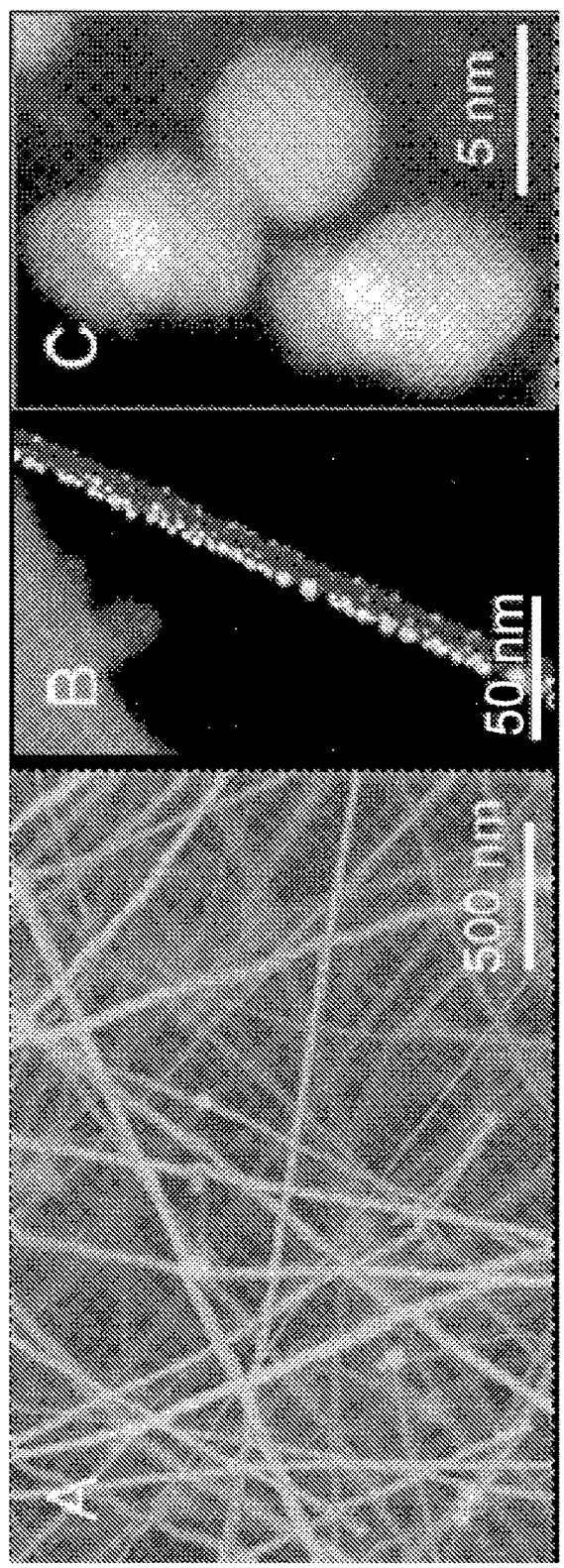
FIG. 4 is a series of images of conduction channels according to this disclosure.
Figure 5:
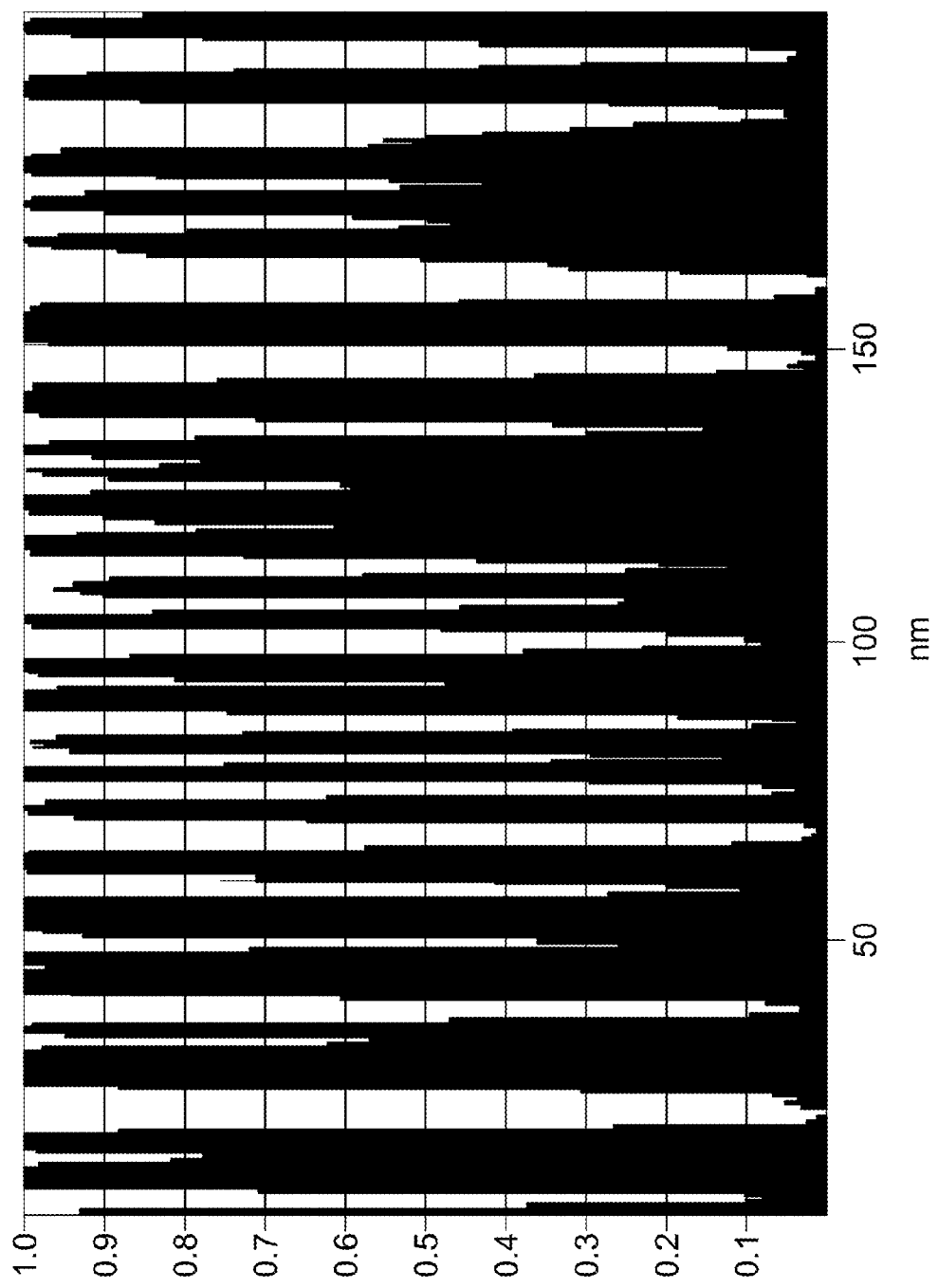
FIG. 5 is a normalized contrast line profile representing the actual spacing between tunneling elements in a tunneling channel shown in FIG. 4B.

Pure BNNTs were grown using growth vapor trapping (GVT) in a regular tube furnace, as described in Lee (2010) and Lee (2008) [Lee (2010); Lee (2008)], which are incorporated herein in their entirety. The as-grown BNNTs were insulating with diameters of ~10-80 nm. A gold film of 6 nm or less in thickness was deposited on one face of the BNNTs by pulsed-laser deposition. A deposition scale indicated that a 6 nm thick film had been deposited, but it is believed that less than this thickness is actually deposited on the BNNTs. The deposited BNNTs were subjected to thermal annealing in $H_2$ ambient at 600° C. for 30 minutes to form a plurality of quantum dots along the axis of the BNNTs. The morphology and structural properties of BNNTs remained unchanged after being modified by the QDs, as confirmed by Raman spectroscopy and FTIR spectroscopy. The resulting QDs-BNNTs were imaged via SEM (FIG. 4A) and STEM (FIGS. 4B and 4C). The gold QDs are crystalline, as evidenced by FIG. 4C, and are preferentially deposited on one side of the BNNTs. Due to spatial confinement, the QDs form a pseudo-one dimensional array of particles with estimated diameters ranging from about 3-10 nm and irregular inter-dot spacing of about 1-5 nm. FIG. 5 shows a normalized contrast line profile which represents the spacing between QDs and that was obtained by STEM scanning the QDs-BNNTs shown in FIG. 4B.

Example 2

Characterizing Tunneling Channels and Varying Length

Figure 6:
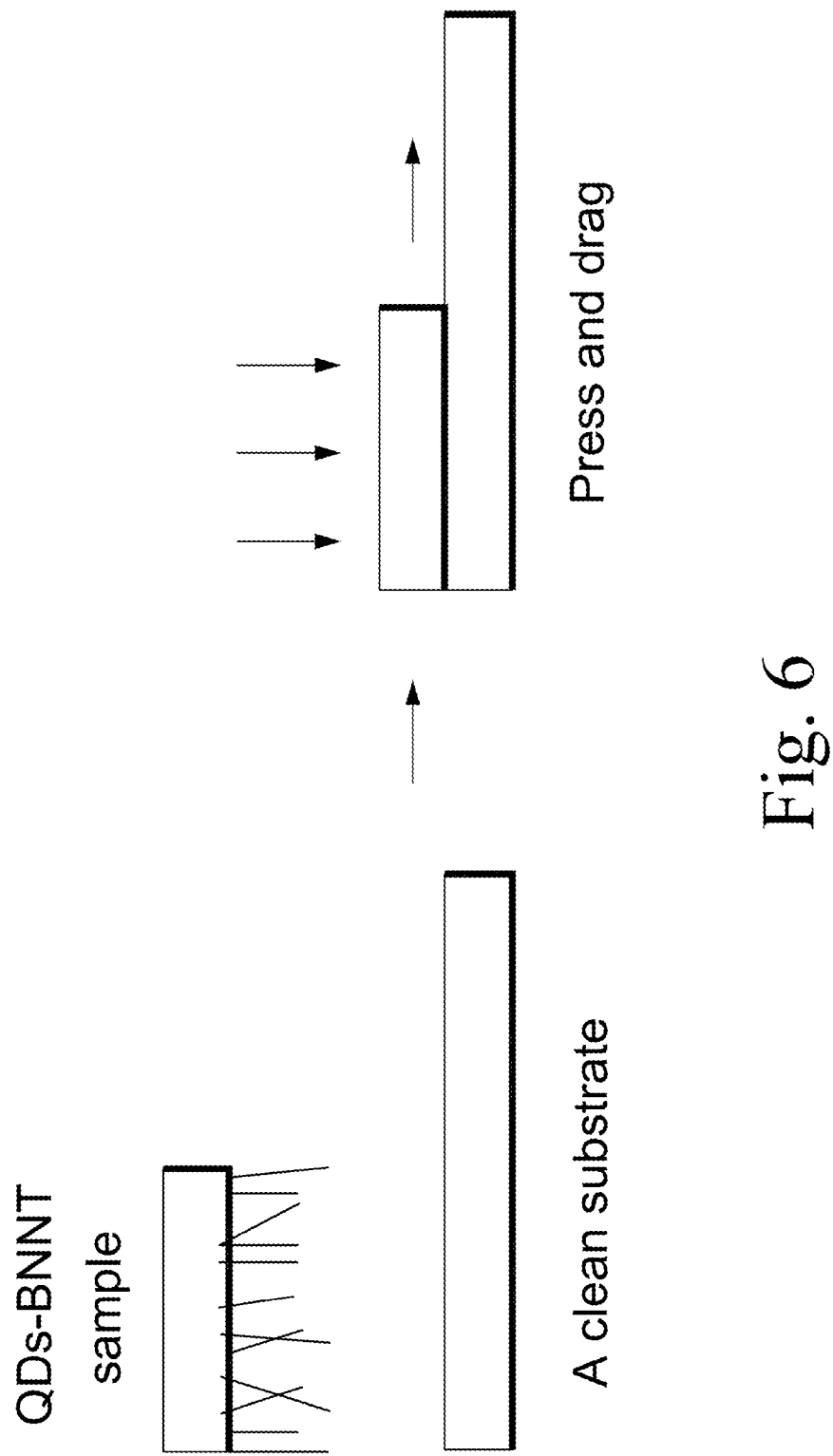
FIG. 6 is a schematic representation generally showing a method of making oriented arrays of tunneling channels or devices according to this disclosure.
Figure 7:
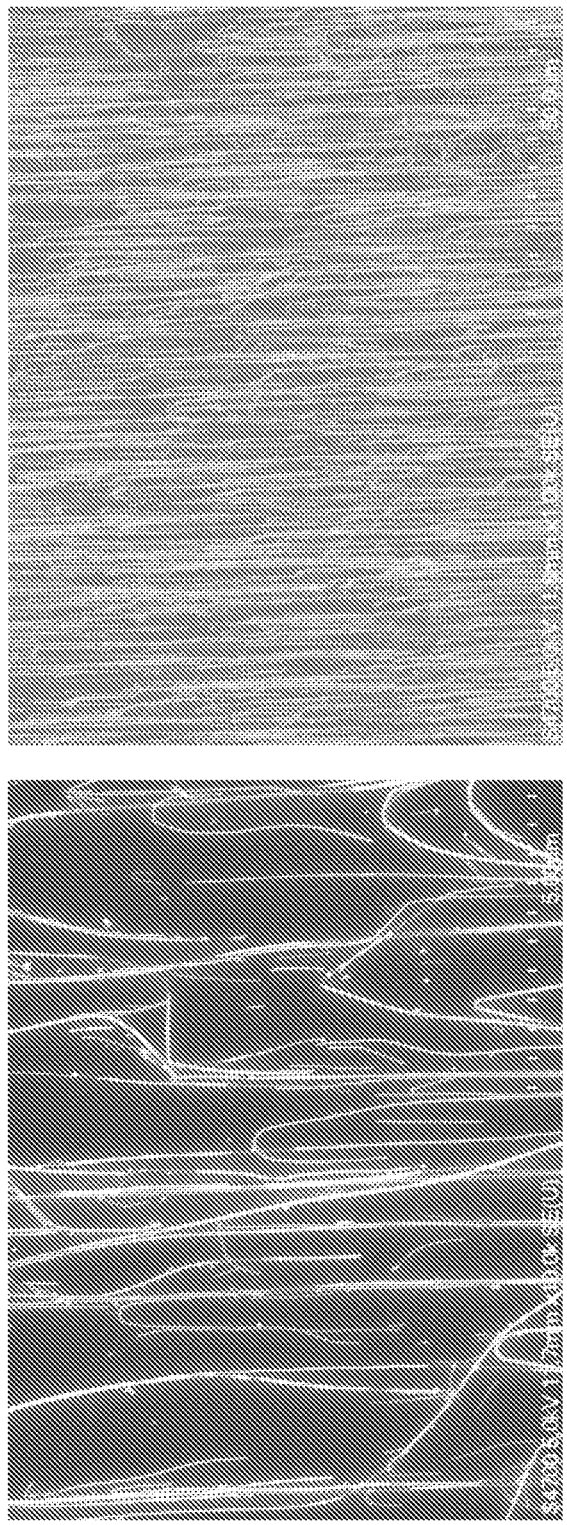
FIG. 7 contains SEM images of oriented arrays of tunneling channels prepared according to this disclosure.
Figure 9:
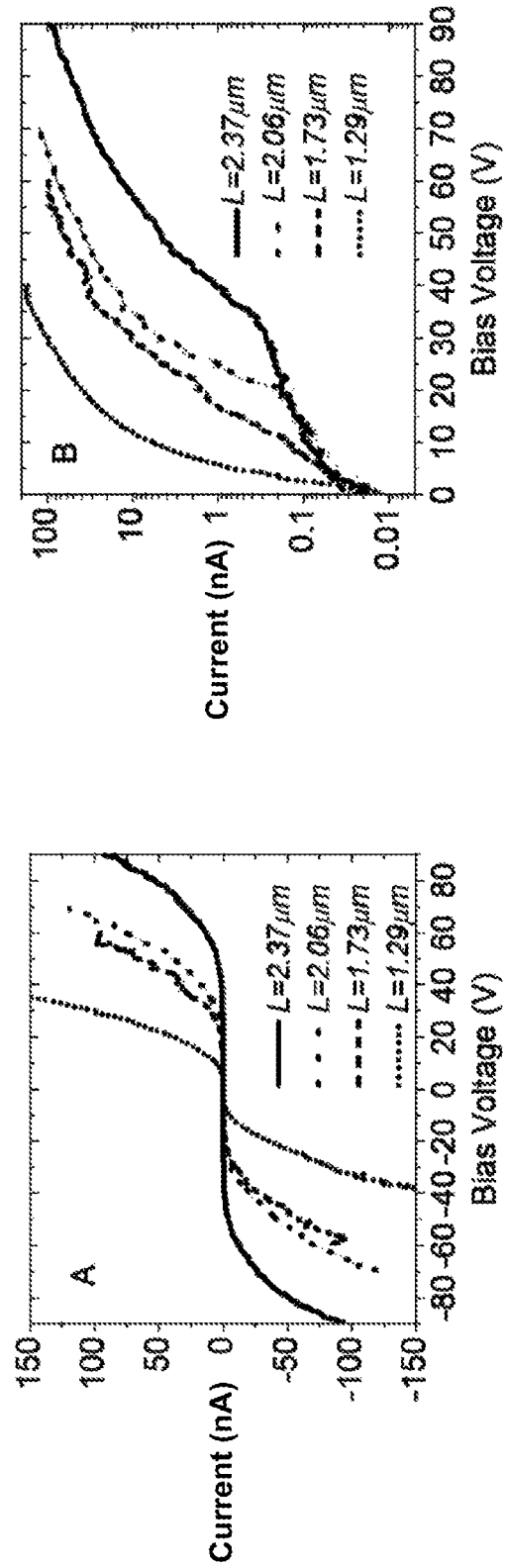
FIG. 9 contains the I-V curves for tunneling channels of varying lengths according to this disclosure in linear (FIG. 9A) and log vertical (FIG. 9B) scale.
Figure 10:
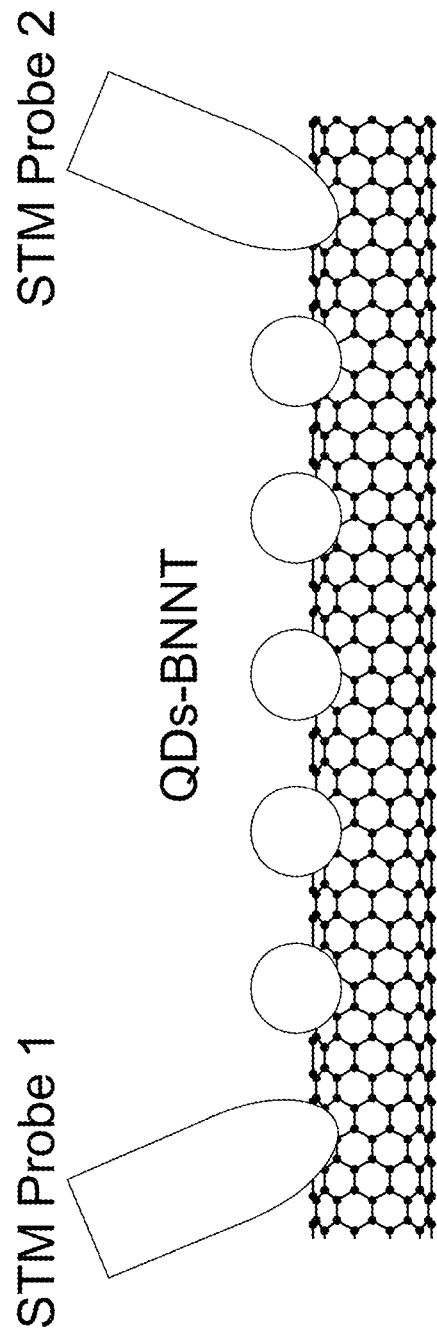
FIG. 10 is a schematic representation of a device according to the present invention. In this schematic, the source electrode is represented by one of the STM probes and the drain electrode is represented by the other STM probe. Note: Tunneling elements are represented as evenly spaced and equal diameter for ease of presentation, and this is not intended to indicate that the elements are evenly spaced or equal diameter.

Gold quantum-dot functionalized BNNTs (Au QDs-BNNTs) were prepared according to the method of Example 1 and transferred onto oxidized Si macrosubstrate by mechanical rubbing, as shown in FIG. 6. A resulting oriented array of Au QDs-BNNTs is shown in FIG. 7. The transferred Au QDs-BNNTs are aligned horizontally on the macrosubstrate surfaces and are well dispersed. The electronic properties of these Au QDs-BNNTs were characterized using a four-probe scanning tunneling microscopy (4-probe STM) system with variable probe spacing. FIG. 8 shows isolated Au QDs-BNNTs in contact with two STM probes at a desired tunneling channel length (L). FIG. 9 shows the resulting electronic properties of the Au QDs-BNNTs. As the data shows, these Au QDs-BNNTs are as insulating as pure BNNTs at low bias voltages ("off" state, current ~$10^{-11}$ A) and conductive at higher bias voltages ("on" state) with a current level as high as ~$10^{-7}$ A. The I-V curves of FIG. 9 show that the turn-on voltage ($V_{on}$) decreases from about 34 V to about 2.0 V as the tunneling channel length decreases from 2.37 µm to 1.29 µm.

Figure 11:
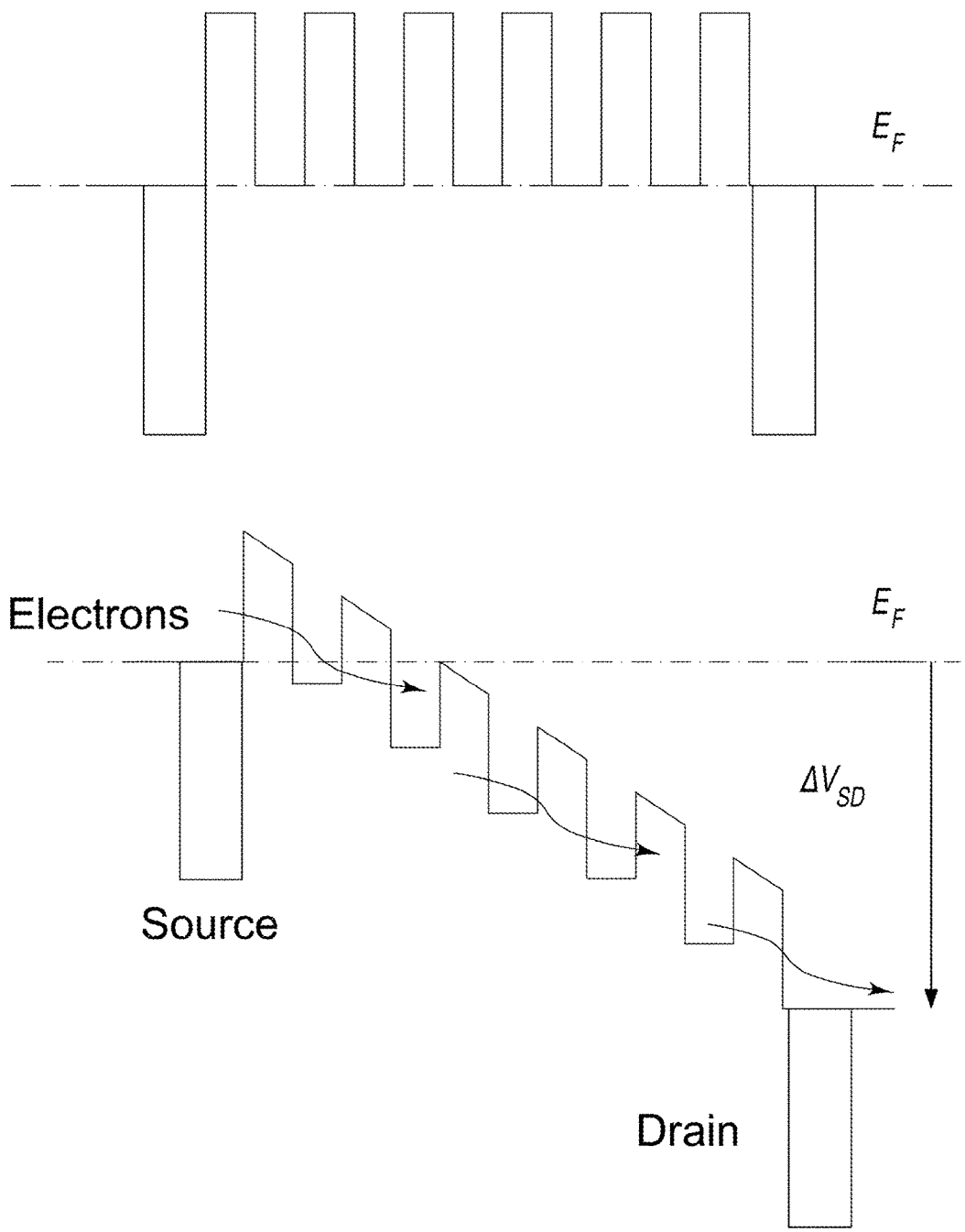
FIG. 11 is a schematic representation of the tunneling barriers present in a tunneling channel according to the present invention in the absence of an applied source-drain voltage ($V_{sd}$) (top) and in the presence of an applied $V_{sd}$ (bottom).

Based on the maximum current levels of the "on" and the "off" states, the on-off ratio is estimated to be on the order of $10^4$. Furthermore, the observed behavior is consistent with the Coulomb blockade behavior that would be expected for electrons tunneling between the QDs. As illustrated schematically at the top of FIG. 11, potential barriers are present between the gold QDs, as they are physically isolated from each other. By applying an electric potential ($V_{sd}$) across the plurality of QDs with the STM probes acting as source and drain electrodes, a potential gradient forms across the plurality of QDs as illustrated schematically at the bottom of FIG. 11. Before $V_{sd}$ is large enough to maintain a steady state of tunneling transitions, current flow is prohibited by the Coulomb blockade in the device. As $V_{sd}$ increases, there is also an accompanying band bending between QDs, as illustrated in FIG. 11. In the "on" state, the I-V characteristics depend on the nature of the tunneling process across the junctions.

Example 3

Tuning the Turn-on Voltage by Applying Gate Potential

Figure 12:
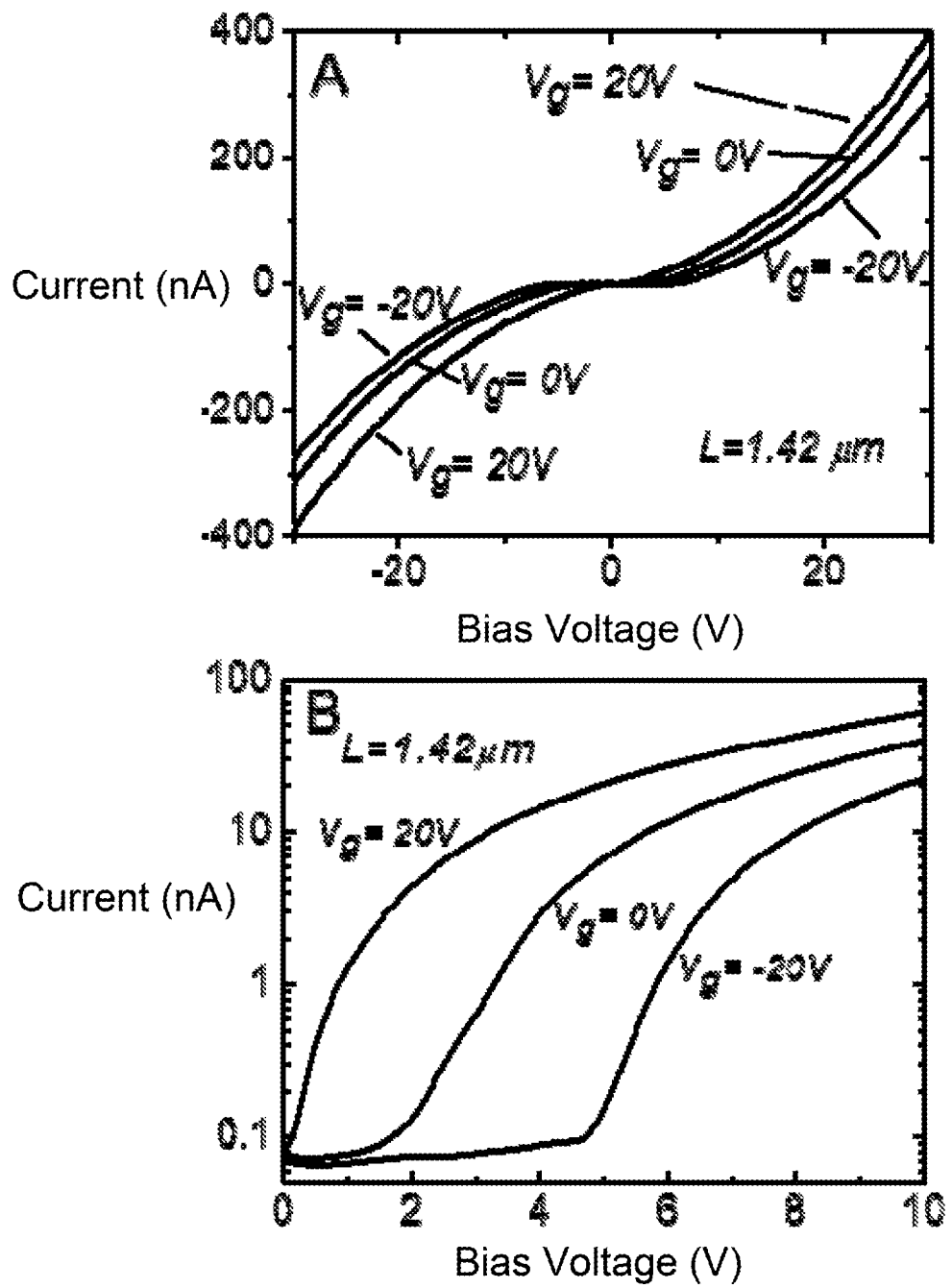
FIG. 12 contains the I-V curves of a tunneling channel according to the present invention under the modulation of gate voltages ($V_g$).

Au QDs-BNNTs were prepared according to the procedure of Example 1 and oriented on a Si macrosubstrate according to the procedure of Example 2. An electric potential was applied to the Si macrosubstrate (i.e. a back-gate configuration). The electronic properties were studied according to the procedure of Example 2, and are reported in FIG. 12. As shown in FIG. 12, the switching behaviors of a QDs-BNNT, namely $V_{on}$, were modified by gate voltages, with a tunable range of $V_{on}$ between zero and 4.8 V at L=1.42 μm.

Example 4

Iron as Tunneling Element Material

Figure 13A:
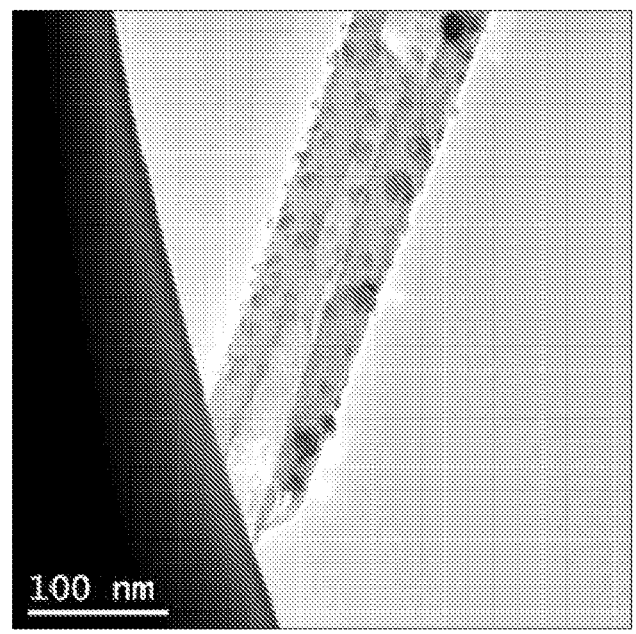
FIG. 13A is an image of a tunneling channel according to the present invention with iron (Fe) QDs.
Figure 13B:
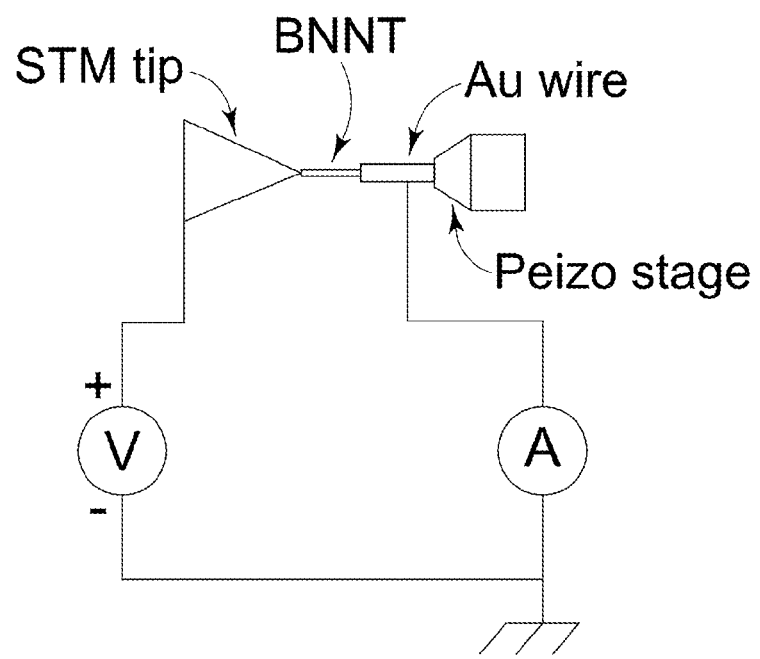
FIG. 13B is a schematic of a method of using a STM probe inside a TEM system.
Figure 13C:
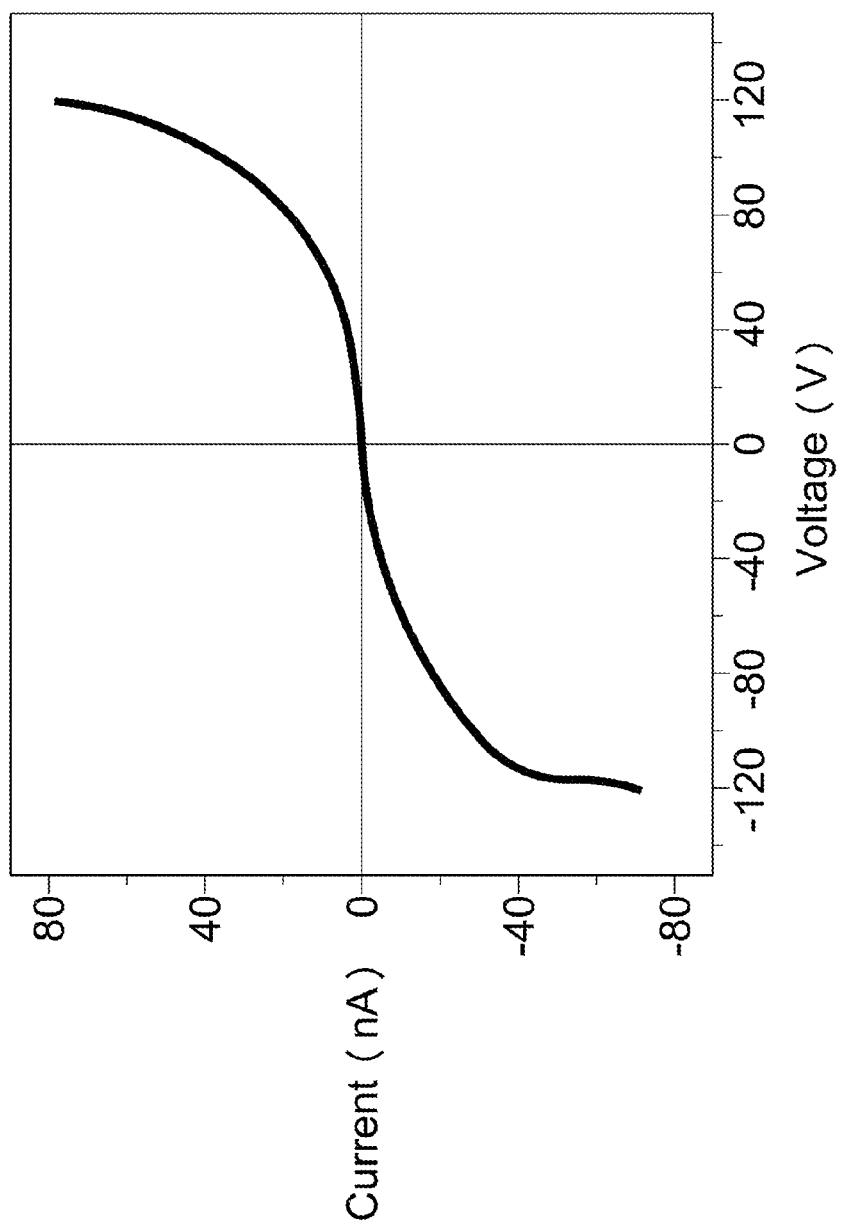
FIG. 13C shows the resulting I-V curves measured for the tunneling channel shown in FIG. 13A using the method represented in FIG. 13B.
Figure 14A:
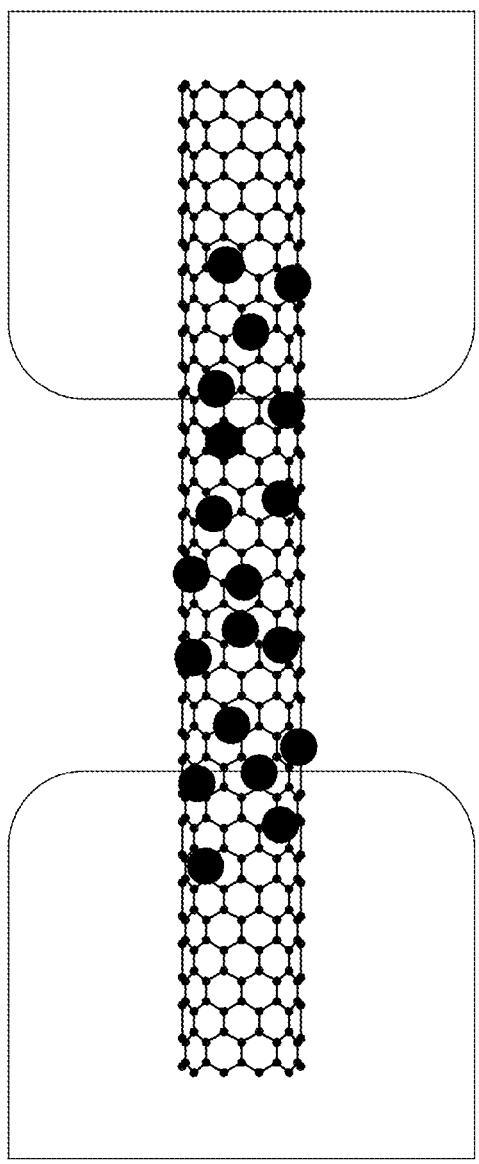
FIG. 14A is a schematic representation of a device according to the present invention, wherein a tunneling channel is located between a source electrode and a drain electrode.
Figure 14B:
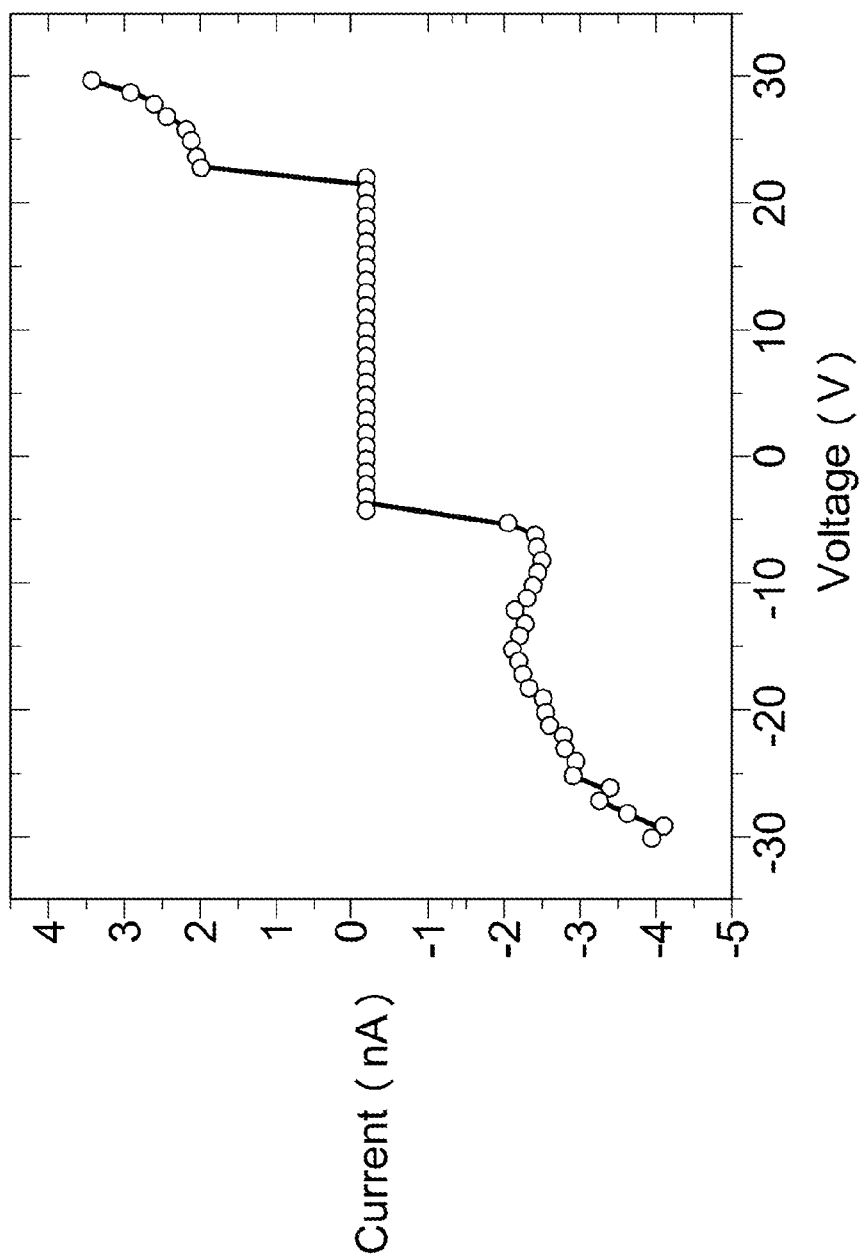
FIG. 14B is the I-V curve of a tunneling channel according to the present invention.
Figure 15A:
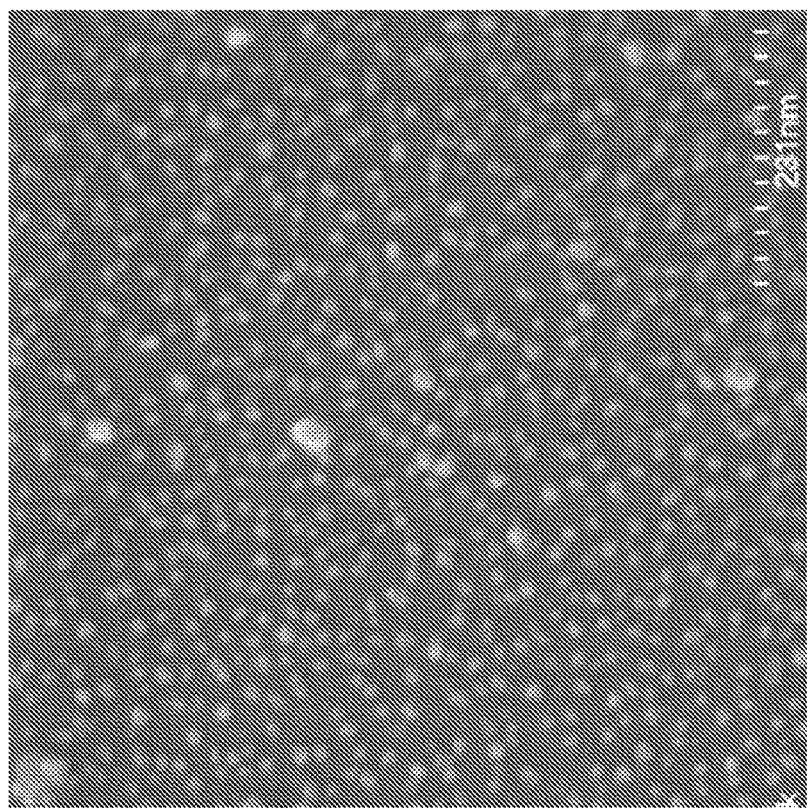
FIG. 15A is a SEM image of Fe quantum dots formed on a two-dimensional insulating substrate, namely an oxidized Si substrate.
Figure 15B:
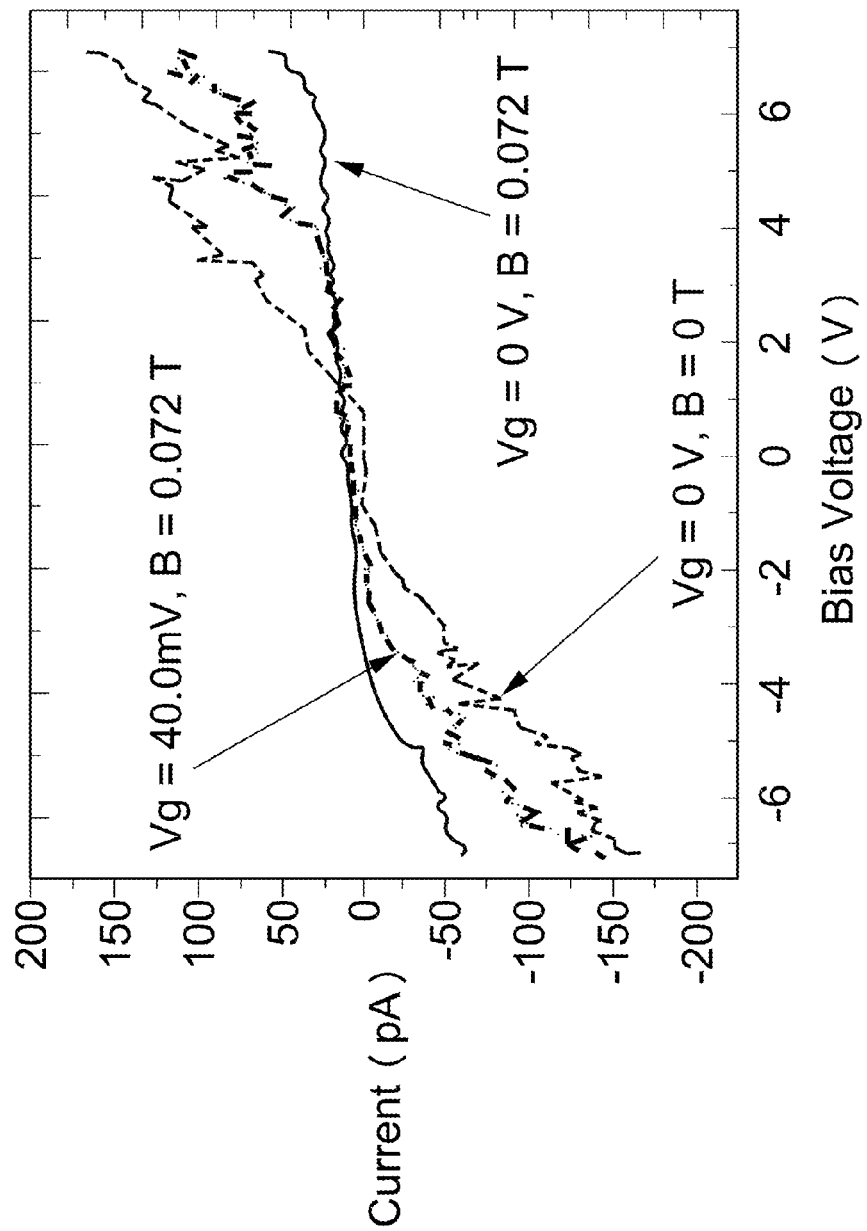
FIG. 15B contains the resulting I-V curves showing the impact of an applied external magnetic field and the combined effect of external magnetic field and gate voltage.
Figure 16:
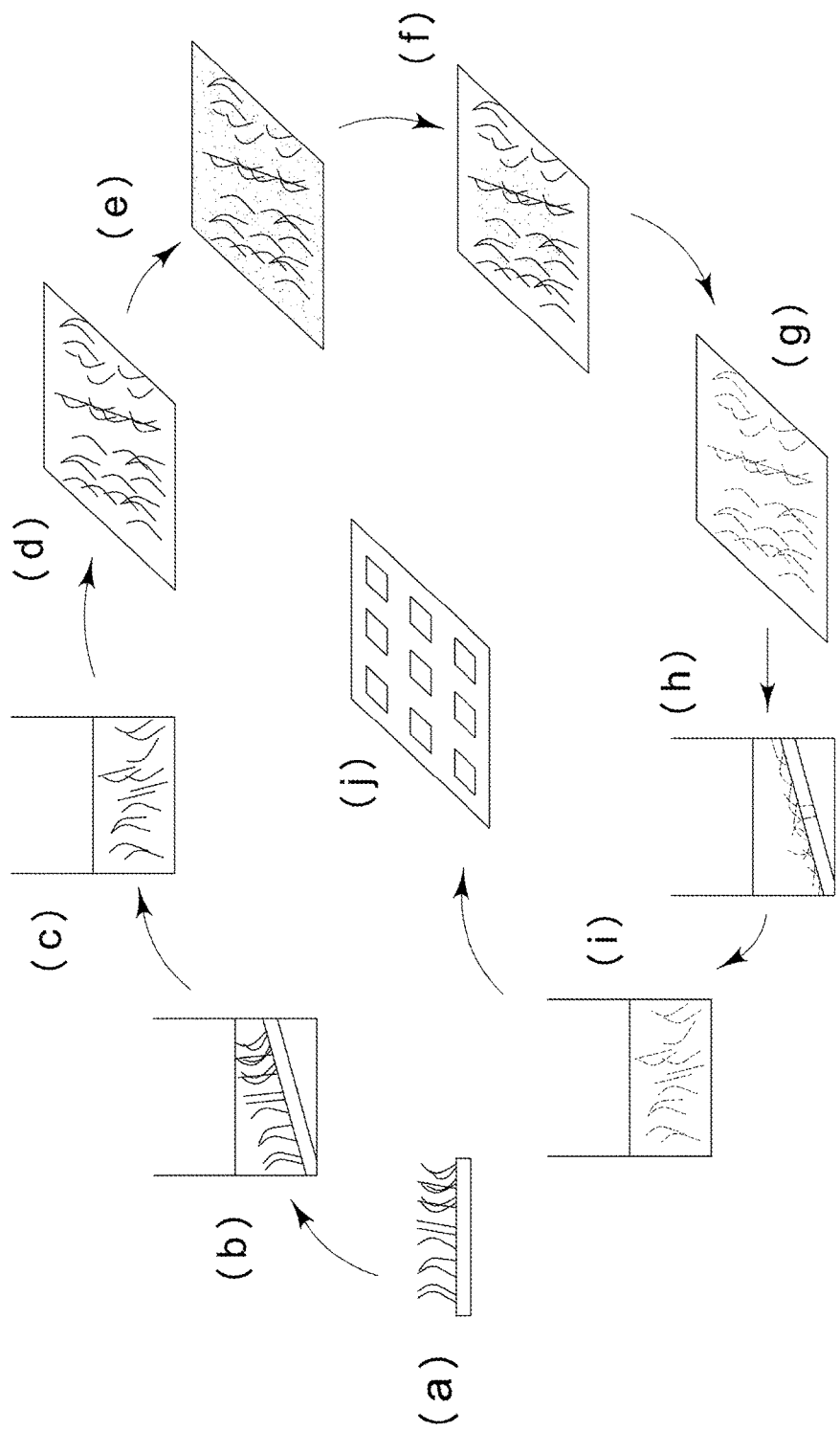
FIG. 16 is a schematic representation of a method of producing oriented arrays.

Iron QDs-BNNTs (Fe QDs-BNNTs) were prepared according to the method of Example 1, substituting an Fe film of a few nanometers for the gold film of Example 1. Fe films of a few nanometers were first deposited on as-grown BNNTs by PLD and then subjected to annealing in hydrogen ambient at 600° C. for 30 minutes to form a plurality of quantum dots. These Fe QDs-BNNTs were attached on an Au wire by mechanically scratching the QDs-BNNT sample with the sharp wire. This Au wire with several Fe QDs-BNNTs attached thereto was then placed on a scanning tunneling microscopy-tunneling electron microscopy (STM-TEM) probe, as shown schematically in FIG. 13B. As shown in FIG. 13A, the STM-TEM probe allows an electric contact to be established between the Fe QDs-BNNTs and a counter electrode (STM tip). A bias voltage was applied along this Fe QDs-BNNT between the Au wire and the STM tip. As shown in FIG. 13C, no current was detected at a low bias voltage (less than ~10 V). At higher bias voltages, current started to flow. It is noted that these iron QDs did not align into a single array (1D) and rather scattered randomly on the surfaces of the BNNT. This result suggest that the use of BNNTs as the channel substrates could confine the deposition of QDs or nanoparticles into pseudo-1D arrays and this is sufficient to function as tunnel FETs as long that the gaps between the QDs are large enough to prohibit current flow at low bias voltages ("off" state) at room temperature and small enough to allow electron tunneling at higher voltages ("on" state). One Fe QDs-BNNT was dispersed on oxidized Si substrates and connected by two Al microelectrodes as shown in FIG. 14A. The "off" state occurred at low bias voltages and turned into an "on" state at higher bias voltages as shown in FIG. 14B.

Example 5

Two-Dimensional Tunneling Channel and Magnetic Gate

Fe films of a few nanometers were deposited on an oxidized Si substrate (oxide thickness 500 nm), as shown in FIG. 9A. As shown in FIG. 9B, these tunneling channels behave like conduction channels of FETs, with an obvious "off" state at low bias voltages and an "on" state at higher bias voltage. Furthermore, external magnetic fields are applied to modify the I-V characters of these conduction channels, as shown in FIG. 9B.

REFERENCES, EACH OF WHICH IS INCORPORATED HEREIN IN ITS ENTIRETY

Y. Cui, Z. H. Zhong, D. L. Wang, W. U. Wang, C. M. Lieber, High performance silicon nanowire field effect transistors. *Nano Letters* 3, 149 (February, 2003).

X. F. Duan et al., High-performance thin-film transistors using semiconductor nanowires and nanoribbons. *Nature* 425, 274 (Sep. 18, 2003).

X. F. Duan, Y. Huang, Y. Cui, J. F. Wang, C. M. Lieber, Indium phosphide nanowires as building blocks for nanoscale electronic and optoelectronic devices. *Nature* 409, 66 (Jan. 4, 2001).

Q. H. Li, Y. X. Liang, Q. Wan, T. H. Wang, Oxygen sensing characteristics of individual ZnO nanowire transistors. *Appl Phys Lett* 85, 6389 (Dec. 27, 2004).

J. Goldberger, D. J. Sirbuly, M. Law, P. Yang, ZnO nanowire transistors. *J Phys Chem B* 109, 9 (Jan. 13, 2005).

K. S. Novoselov et al., Electric field effect in atomically thin carbon films. *Science* 306, 666 (Oct. 22, 2004).

Y. M. Lin et al., 100-GHz Transistors from Wafer-Scale Epitaxial Graphene. *Science* 327, 662 (Feb. 5, 2010).

C. H. Lee, M. Xie, V. Kayastha, J. S. Wang, Y. K. Yap, Patterned Growth of Boron Nitride Nanotubes by Catalytic Chemical Vapor Deposition. *Chem Mater* 22, 1782 (Mar. 9, 2010).

C. H. Lee, J. S. Wang, V. K. Kayatsha, J. Y. Huang, Y. K. Yap, Effective growth of boron nitride nanotubes by thermal chemical vapor deposition. *Nanotechnology* 19, (Nov. 12, 2008).

H. M. Ghassemi, C. H. Lee, Y. K. Yap, R. S. Yassar, Field emission and strain engineering of electronic properties in boron nitride nanotubes. *Nanotechnology* 23, (Mar. 16, 2012).

P. S. K. Karre, P. L. Bergstrom, G. Mallick, and S. P. Karna, "Room Temperature Operational Single Electron Transistor Fabricated by Focused Ion Beam Deposition," *J. Appl. Phys.* 102, 24316 (2007).

Hua Chen, Hongzhou Zhang, Lan Fu, Ying Chen, James S. Williams, Chao Yu, and Dapeng Yu, "Nano Au-decorated boron nitride nanotubes: Conductance modification and field-emission enhancement" *Appl. Phys. Lett.* 92, 243105 (2008).

T. Sainsbury, T. Ikuno, D. Okawa, D. Pacilé, J. M. J. Fréchet, and A. Zettl, "Self-assembly of gold nanoparticles at the surface of amine- and thiol-functionalized born nitride nanotubes," *J. Phys. Chem. C* 111, 12992-12999 (2007).

What is claimed is:

1. A tunneling channel of a field effect transistor, the tunneling channel comprising:
an electrically insulating, essentially one-dimensional channel substrate, wherein the electrically insulating, essentially one-dimensional channel substrate is selected from the group consisting of a nanotube, a nanowire, a nanofiber, and a nanorod;
a source region, a drain region, and a gate region disposed therebetween, the electrically insulating, essentially one-dimensional channel substrate coupling the source region to the drain region;
a plurality of randomly spaced tunneling elements contacting the electrically insulating, essentially one-dimensional channel substrate, wherein the plurality of randomly spaced tunneling elements includes a plurality of quantum dots for electrically conducting a source-drain tunneling current based on a turn-on voltage;
wherein applying a source-drain voltage of greater than the turn-on voltage produces the source-drain tunneling current of greater than about 10 pA via the plurality of quantum dots, wherein applying a source-drain voltage of less than the turn-on voltage produces a source-drain tunneling current of less than about 10 pA via the plurality of quantum dots, wherein the turn-on voltage at room temperature is between about 0.1 V and about 40 V.

2. The tunneling channel of claim 1, wherein the plurality of randomly spaced tunneling elements comprises a material selected from the group consisting of metal, doped semiconductors, graphene, carbon nanotubes, superconductors, conductive molecules, and combinations thereof.

3. The tunneling channel of claim 1, wherein the plurality of randomly spaced tunneling elements comprises a material selected from the group consisting of Au, Ag, Al, Fe, Ni, Mo, doped Si, doped Ge, doped BN, doped AlN, doped GaN, doped GaP, doped InP, doped GaAs, doped InAs, doped ZnO, doped ZnS, doped InAs, and combinations thereof.

4. The tunneling channel of claim 1, wherein the plurality of randomly spaced tunneling elements does not require insulation from the atmosphere.

5. The tunneling channel of claim 1, wherein the electrically insulating, essentially one-dimensional channel substrate comprises a material selected from the group consisting of insulating semiconductors, oxides, nitrides, glasses, insulating polymers, and combinations thereof.

6. The tunneling channel of claim 1, wherein the electrically insulating, essentially one-dimensional channel substrate comprises a boron nitride nanotube.

7. A device comprising:
a tunneling channel including an electrically insulating, essentially one-dimensional channel substrate and a plurality of randomly spaced tunneling elements contacting the electrically insulating, essentially one-dimensional channel substrate, wherein the electrically insulating, essentially one-dimensional channel substrate is selected from the group consisting of a nanotube, a nanowire, a nanofiber, and a nanorod, and wherein the plurality of randomly spaced tunneling elements includes a plurality of quantum dots, a source region, a drain region, and a gate region disposed therebetween, the electrically insulating, essentially one-dimensional channel substrate coupling the source region to the drain region, and a source electrode at the source region and a drain electrode at the drain region, wherein the plurality of quantum dots for electrically conducting a source-drain tunneling current based on a turn-on voltage, wherein applying a source-drain voltage of greater than the turn-on voltage produces the source-drain tunneling current of greater than about 10 pA via the plurality of quantum dots, wherein applying a source-drain voltage of less than the turn-on voltage produces a source-drain tunneling current of less than about 10 pA via the plurality of quantum dots, and wherein the turn-on voltage at room temperature is between about 0.1 V and about 40 V.

8. The device of claim 7, further comprising a gate electrode at the gate region.

9. The device of claim 7, wherein the tunneling channel is oriented on a macrosubstrate.

10. A logic gate comprising the device of claim 7.

11. The logic gate of claim 10, wherein a logic operator of the logic gate is selected from the group consisting of AND, OR, XOR, NOT, NAND, NOR, XNOR, and combinations thereof.

* * * * *